Figure 2:
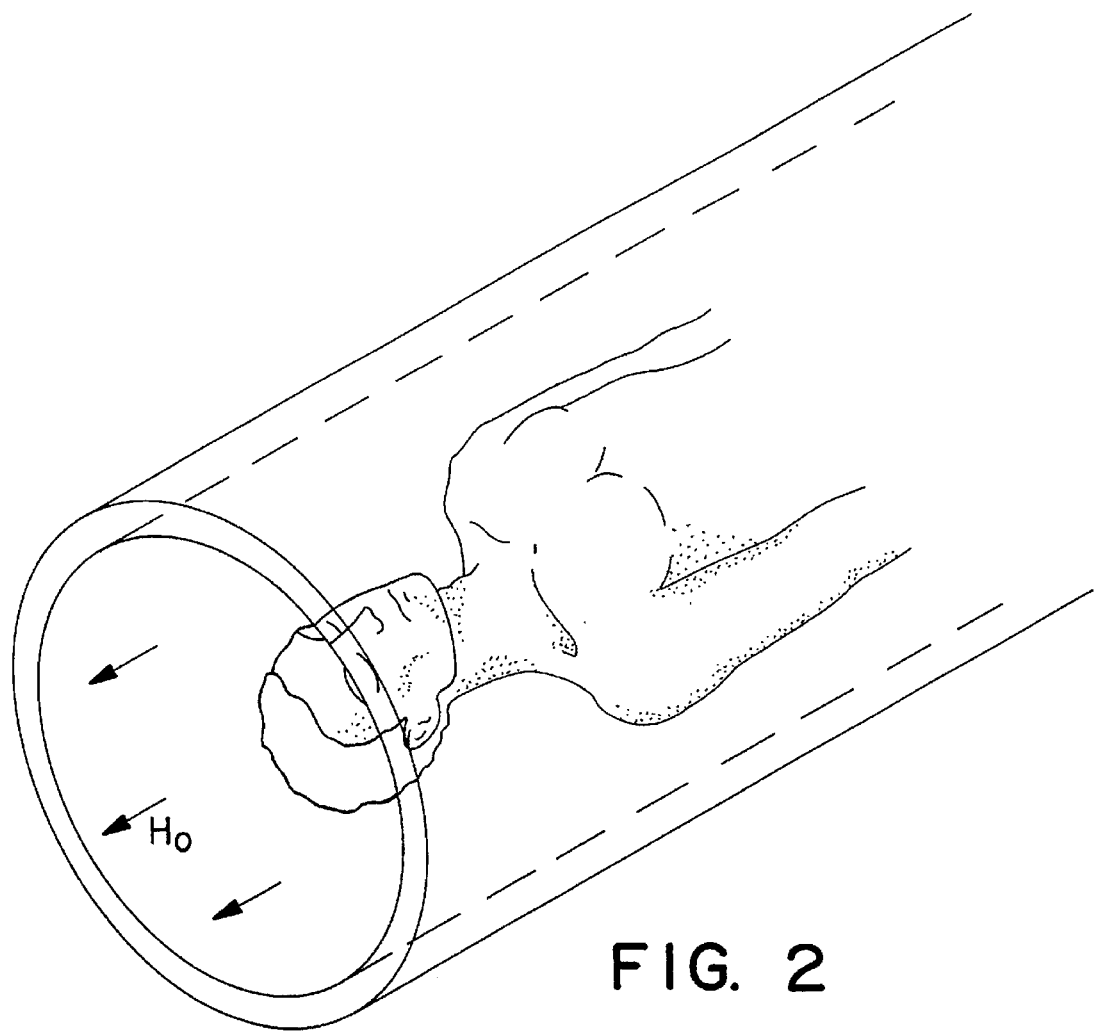

United States Patent [19]
Barone et al.

[11] Patent Number: 5,646,529
[45] Date of Patent: Jul. 8, 1997

[54] SYSTEM FOR PRODUCING HIGH-RESOLUTION MAGNETIC RESONANCE IMAGES WITH A SHORT MEASUREMENT TIME

[75] Inventors: Piero Barone; Giovanni Sebastiani, both of Rome, Italy

[73] Assignee: Consiglio Nazionale delle Ricerche, Rome, Italy

[21] Appl. No.: 424,394
[22] PCT Filed: Nov. 2, 1992
[86] PCT No.: PCT/IT92/00076
 § 371 Date: Jun. 6, 1995
 § 102(e) Date: Jun. 6, 1995
[87] PCT Pub. No.: WO94/10550
 PCT Pub. Date: May 11, 1994
[51] Int. Cl.$^6$ ................................................. G01V 3/00
[52] U.S. Cl. .................................................... 324/309
[58] Field of Search ............................... 324/309, 307, 324/300; 128/653.2

[56] References Cited

U.S. PATENT DOCUMENTS

| | | | |
|---|---|---|---|
| 5,086,275 | 2/1992 | Roemer | 324/309 |
| 5,157,330 | 10/1992 | Kaufman et al. | 324/320 |
| 5,285,157 | 2/1994 | Zur | 324/307 |
| 5,427,102 | 6/1995 | Shimode et al. | 324/318 |

OTHER PUBLICATIONS

Smith et al, "Magnetic Resonance Image Noise Reduction and Resolution Enhancement Using Parametric Techniques" Control & Computers vol. 15, No. 2, pp. 75–99 (1987).

Sano et al, "MR Image Reconstruction From Half the Data Using a Phase Map." Systems & Computers in Japan vol. 20, No. 2 pp. 60–66 (Feb. 1989).

*Primary Examiner*—Sandra L. O'Shea
*Assistant Examiner*—Raymond Y. Mah
*Attorney, Agent, or Firm*—Wenderoth, Lind & Ponack

[57] ABSTRACT

A system produces high-resolution magnetic resonance (MR) images from the data measured by the magnetic resonance machine. The system extrapolates, using a method "ad hoc", a function of the measured data. This makes it possible to reduce the number of data measured, giving consequent reduction in the overall measurement time. Further, a special contrast measurement is used, which makes it possible to choose the image automatically from a group of possible candidates, consistent with the measured data.

14 Claims, 38 Drawing Sheets

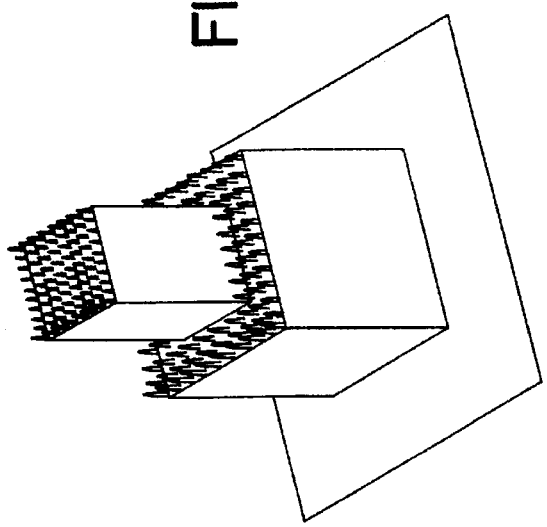
FIG. IA
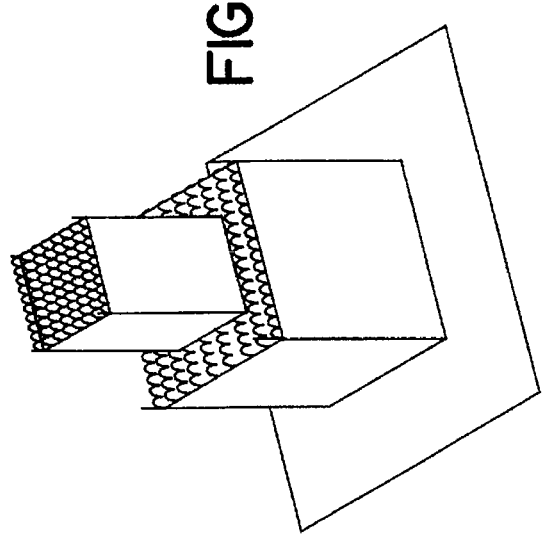
FIG. IB
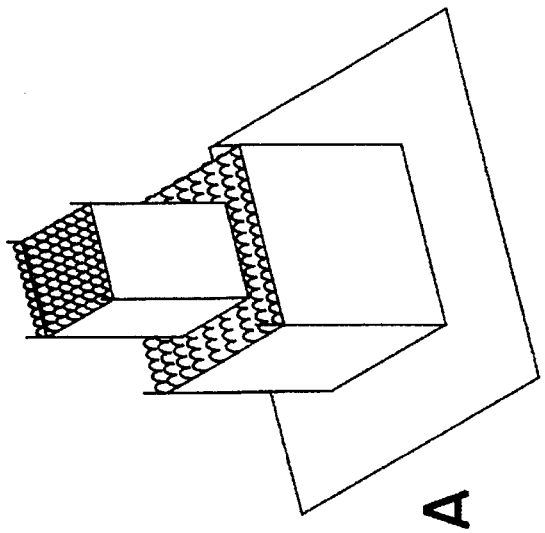
FIG. IC
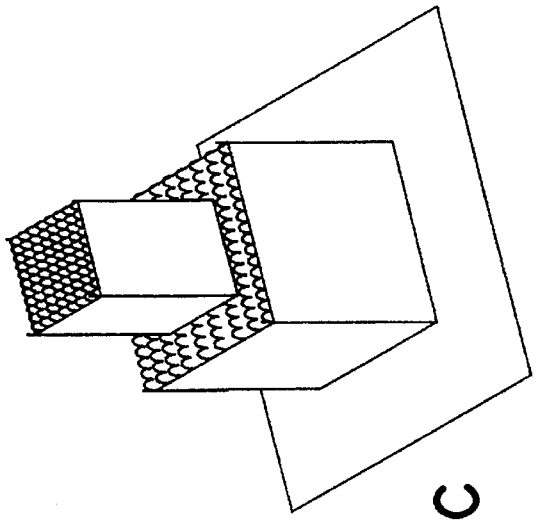
FIG. ID

SYSTEM FOR PRODUCING HIGH-RESOLUTION MAGNETIC RESONANCE IMAGES WITH A SHORT MEASUREMENT TIME

DESCRIPTION

Introduction and description of the system used

Magnetic Resonance (MR) is a method of investigation which allows observation of the interaction of a system of nuclei in the presence of a magnetic field. The information obtained relate to the concentration of the nuclei themselves, their chemical surroundings, and the interactions within the system.

The first applications were found to be extremely useful in the physical and chemical fields. Subsequent developments in technique also led to applications in the field of biology, and finally in that of medicine. In the latter field, MR makes it possible to obtain images representing planar cross-sections of the human body, of a quality comparable with that of X-ray tomography. MR is at present the most widely used technique for the diagnosis and study of neurological diseases, and its use is spreading rapidly to other areas of diagnosis. MR images in medicine are based on the resonance of the Hydrogen nuclei found in water and lipids.

The only physical dimension which can be measured is the duration in time of an electric signal; the image is therefore built up from a group of signals, measured according to the following.

With the object of producing an MR image, representing a planar cross-section of an three-dimensional physical object, the object to be examined is placed in an area having a strong static and homogeneous magnetic field, of an intensity equivalent to 0.5–1.5 T (see FIG. 2). Following this, the magnetic field is perturbed, by adding to the static and homogeneous field an oscillating field, known as a radio frequency impulse, which is perpendicular to the former and at a much lower intensity. The frequency spectrum of the radio frequency impulse is centered around the resonance frequency of the nuclei—static field system, which for the Hydrogen nucleus and with a field of 1.5 T is equivalent to approximately 64 Mhz, with a bandwidth of around one kHz. In this way, the system of nuclei of the object, on absorbing the energy transported by the impulse, is excited.

With the aim of exciting only those nuclei contained within a thin portion around the section under consideration, the following method is used. Simultaneously with the radio frequency impulse, a further static field is added, directed like the static and homogeneous one, whose value is linearly proportional to the height with respect to the plane of the cross-section, with a typical gradient value of approximately $5.10^{-3}$ T/m (see FIG. 3). Since the resonance frequency of the nuclei—static field system is linearly proportional, with a constant known as the gyromagnetic ratio, to the value of the static field, during the impulse said frequency will depend in a linear manner on the height with respect to the plane of the cross-section (see FIG. 4). From quantum mechanics it is known, furthermore, that, in order for the nuclei to absorb energy through the impulse, the resonance frequency must be within the frequency band of the impulse spectrum. There is therefore a portion of space, between two planes parallel to the cross-section and opposite to it, in which the resonance frequency lies within the impulse frequency band, while this does not occur outside said portion. Therefore, the nuclei excited by the impulse are only those within said portion. The thickness of the portion can be calculated by dividing the bandwidth of the impulse spectrum by the gyromagnetic ratio, and is typically equal to 0.005–0.01 m. By means of the radio-frequency impulse, applied in the presence of a gradient in the static field, only the nuclei contained in a thin portion of space around the cross-section plane have thus been excited (see FIG. 5).

If, at this point, the nuclei are left in the presence of the static and homogeneous field alone, they will all have the same resonance frequency and will emit the energy previously absorbed, in the form of electromagnetic radiation with a spectrum concentrated around said frequency. This can be detected using a receiving circuit, within which an oscillating electric signal is thus induced, having a frequency equal to the resonance frequency and decreasing exponentially until reaching zero. The exponential decay of the signal is due to interactions between adjacent nuclei, which destroy the coherence of the contribution to the signal given by single nuclei.

Figure 6:
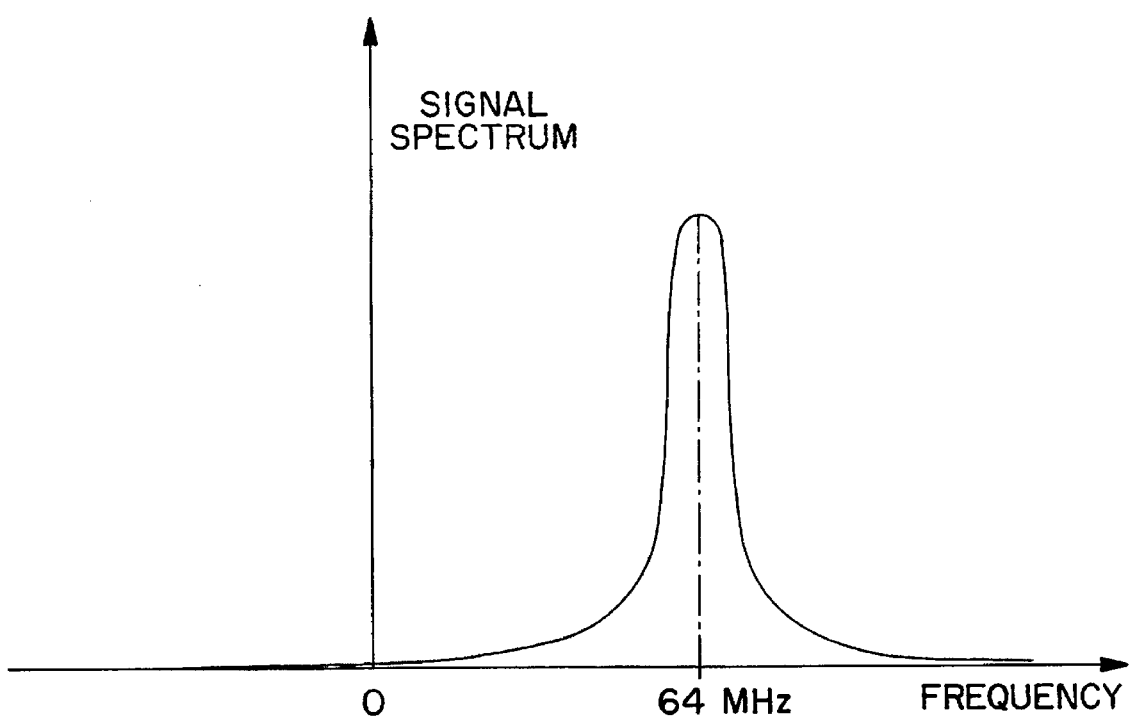

The frequency spectrum of said signal is a Lorentz function centered around the resonance frequency (see FIG. 6). The signal is then amplified and, after this, multiplied by two reference signals, sinusoidally varying in time and with a frequency equivalent to that of resonance and with a phase shift of 90° one from the other. After multiplication, each of the two signals obtained is frequency filtered through a low-pass filter, so that the frequency spectrum of the filtered signals is of a Lorentz type, centered around the frequency zero.

Thus, in practice, the measured electrical signal, which is the only physical dimension measured in an MR experiment, has two components, and it is easier to treat it as a complex function, whose real part is equal to one of the two components and whose imaginary part is equal to the other. Furthermore, the signal is acquired digitally for a fixed number of different moments in time (512–1024).

The signals used to form an MR image are in reality acquired by maintaining the nuclei within the static and homogeneous field and an additional static field, directed in the same way as the static homogeneous one. The value of the additional field is linearly proportional to one of the two coordinates of a two-dimensional cartesian system, lying on the plane of the cross-section, having a gradient value of approximately $5.10^{-3}$ T/m (see FIG. 7). In this manner, the nuclei located in points of the cross-section having the same value of the above mentioned coordinate, all have the same resonance frequency and emit a signal at said frequency; furthermore, there is a linear relationship between said frequency and the value of the above mentioned coordinate. The signal spectrum measured will therefore have a wider frequency range than in the case in which there is no gradient and the signal will decay more rapidly.

Furthermore, as it is also simpler to work with signals which first increase and then decrease, instead of with signals which decrease only, the following method is used. After the radio frequency impulse has ended, the system is left in the presence of the gradient along the first coordinated axis, but without acquisition of the signal. After a certain period of time from the end of the impulse, a new impulse, lasting longer than the first one but in the presence of the static and homogeneous field alone, is sent to the system. This causes the appearance of a signal, first increasing and then decreasing, concentrated around a moment in time which is separated from the first impulse by an amount of time double the time which elapses between the two impulses. In the presence of the gradient along the first coordinate axis, the signal is then acquired digitally in a time interval centered around the instant in time where the signal is concentrated (see FIG. 8).

Figure 9:
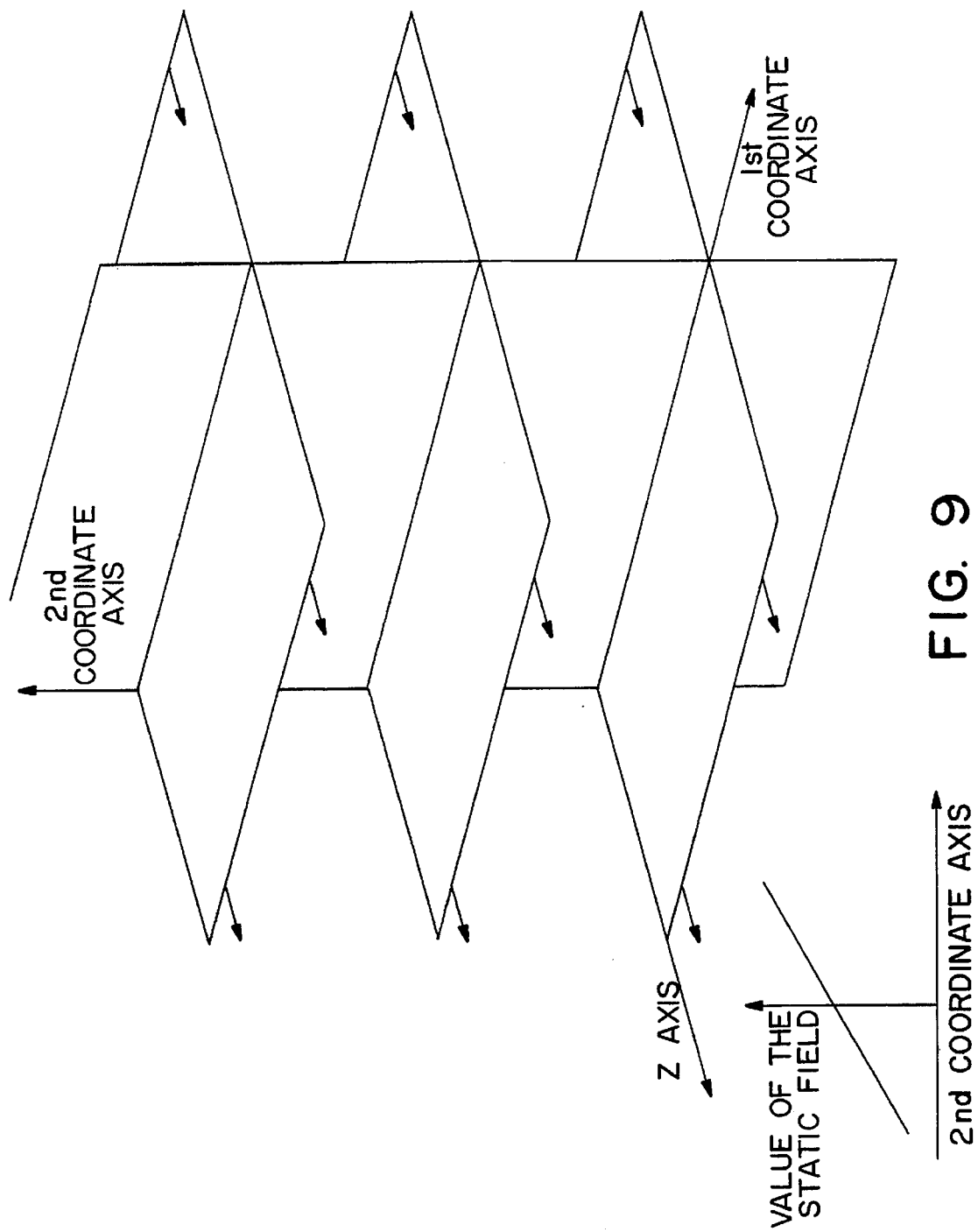

In order to obtain a two-dimensional image, representing the density function of the nuclei in the cross-section under consideration, during the time interval between the two impulses, the nuclei are left in the presence of the static and homogeneous field, of the additional static field, whose value is linearly proportional to the first of the two coordinates, and of a further static field, which is likewise directed in the same way as the other two, and whose value is linearly proportional to the second of the two coordinates (see FIG. 9).

Figure 10:
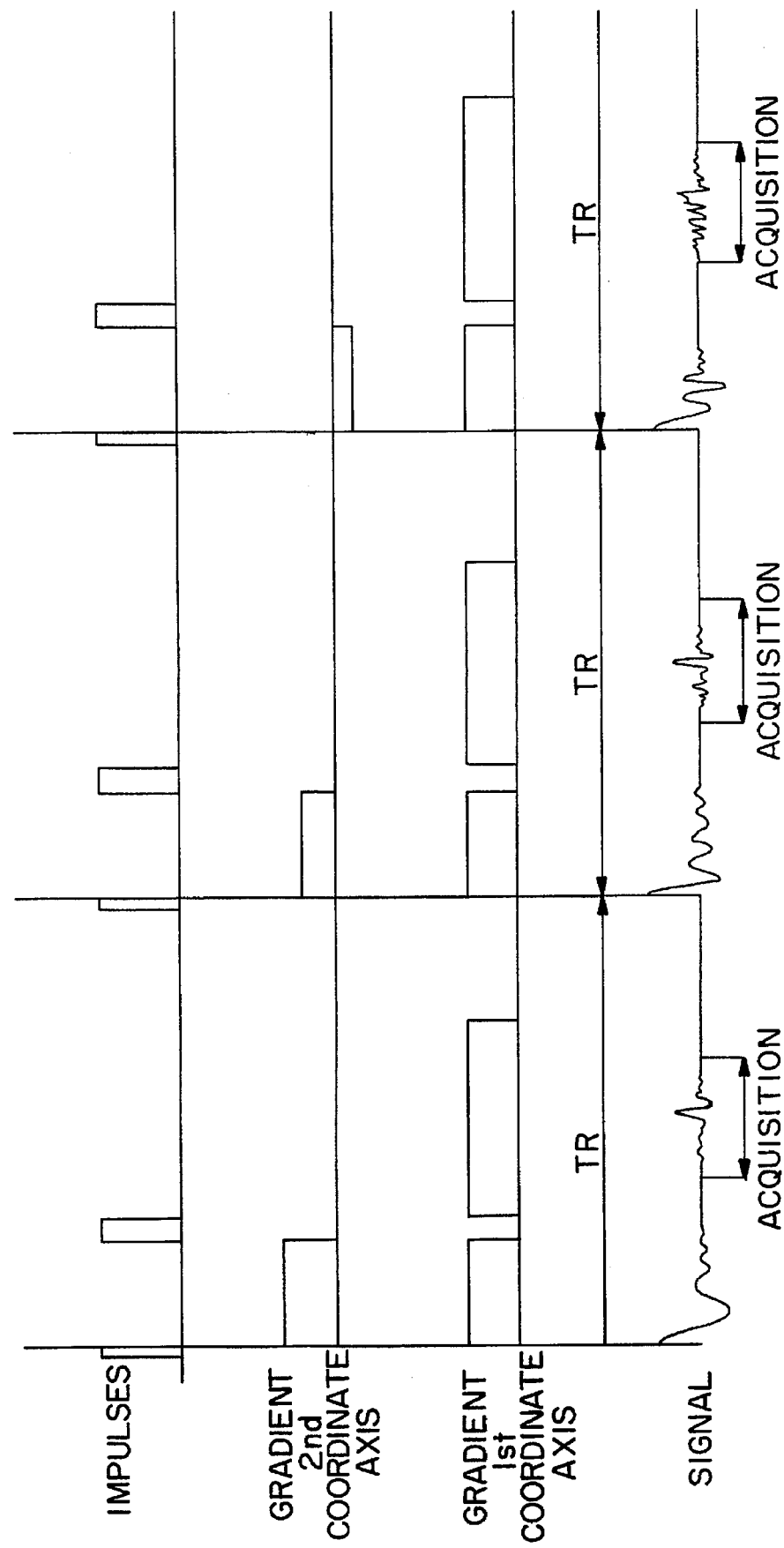

The procedure described above, made up of: 1st impulse—a gradient along both axes—2nd impulse—a gradient along one axis only with acquisition of the signal, is repeated consecutively for a certain number of times (128–256), with a constant spacing in time equivalent to 0.4–2.0 s between corresponding elements of two subsequent repetitions (see FIG. 10). The only element which differs in the two repetitions is the value of the gradient used along the second coordinate axis. In correspondence with each repetition, the signal is digitally acquired for a certain number of different instants in time (512–1024). At the end of the signal measurement stage, a matrix of complex numbers (measured data) is therefore available, with a number of rows equal to the number of different signals acquired, that is to say to the number of different values used for the gradient along the second coordinate axis, and a number of columns equal to the number of different instants in time in which each signal is sampled (see FIG. 11).

Using the physical theory (see "Magnetic Resonance Imaging: Mathematical Aspects and Simulation". Report reproduced at Istituto per le Applicazioni del Calcolo Mauro Picone, pamphlet No. 15, Consiglio Nazionale delle Ricerche, November 1989), it can be shown that, if decay due to interaction between adjacent nuclei is passed over, the data measured are the coefficients of the Fourier series of the image. The MR image is therefore formed, using the measured data, by means of the truncated Fourier series.

The resolution which can be obtained with the method in use increases with the increase of the number of coefficients used, that is to say the number of data measured and consequently the time required to measure them. Furthermore, the quality of the resulting image is directly proportional to the number of coefficients used. In effect, by progressively reducing the number of coefficients used, the image shows in a more and more marked manner the Gibbs artifact, also known as the truncation artifact, which consists in spurious oscillations concentrated around the edges of the image (see FIG. 12). Therefore, the higher the quality desired, the longer the time necessary to measure the data required. Said time is directly proportional to the number of signals measured. In the medical field, however, it is not possible to extend the measurement time too much, because the movements of the patient, forced to remain still for a period of time equivalent to 4–10 minutes within a cylinder of approximately 1 m in diameter, are the cause of noise and disturbances of the image. It is therefore necessary to perform measurements for a period of time which is long enough to obtain a sufficiently large number of Fourier coefficients as to minimize the truncation artifacts, but not too long, in order to limit the effects of movements. In certain types of image this compromise is not reached, and the truncation artifact is present in the image. Furthermore, even when a compromise is reached, a system allowing reduction of the measurement time without inducing loss of resolution and/or the presence of artifacts in the image would provide obvious advantages, in terms of the number of MR examinations performed daily and of the cost of each examination. To give an idea, it is useful to recall the fact that, for diagnostic purposes, it is often necessary to obtain more than one image, so that the overall duration of an MR examination is on average equivalent to 30–60 minutes.

The aims reached by the system object of the present invention are:

reduction by a factor equivalent to at least two, with respect to the system presently in use, of the number of data required to obtain an image of a predetermined quality; in the field of medicine this would mean the reduction of the time the patient has to spend in the machine by the same factor, thus decreasing the influence of movements on the quality of the image;

reduction (or elimination) of the truncation artifact;

possibility of performing, in the same measurement time required for the systems in use, of enlargements of details of the image, with increased resolution and without any extra cost.

BRIEF DESCRIPTION OF THE SYSTEM OBJECT OF THE INVENTION

The system consists in a new method for the formation of high-resolution MR images with reduced measurement time, starting from the data measured by the machine.

Figure 15:
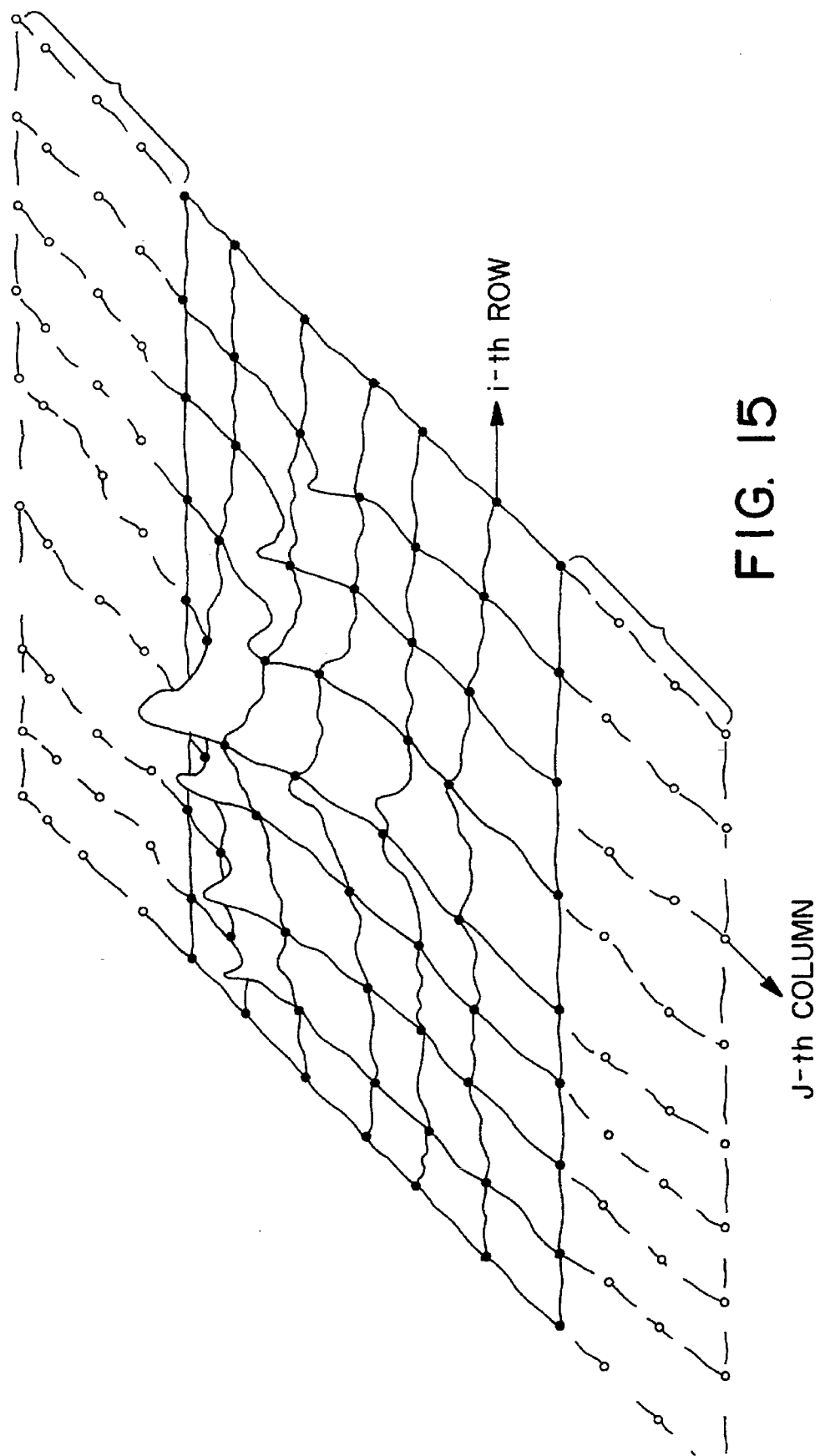
Figure 16:
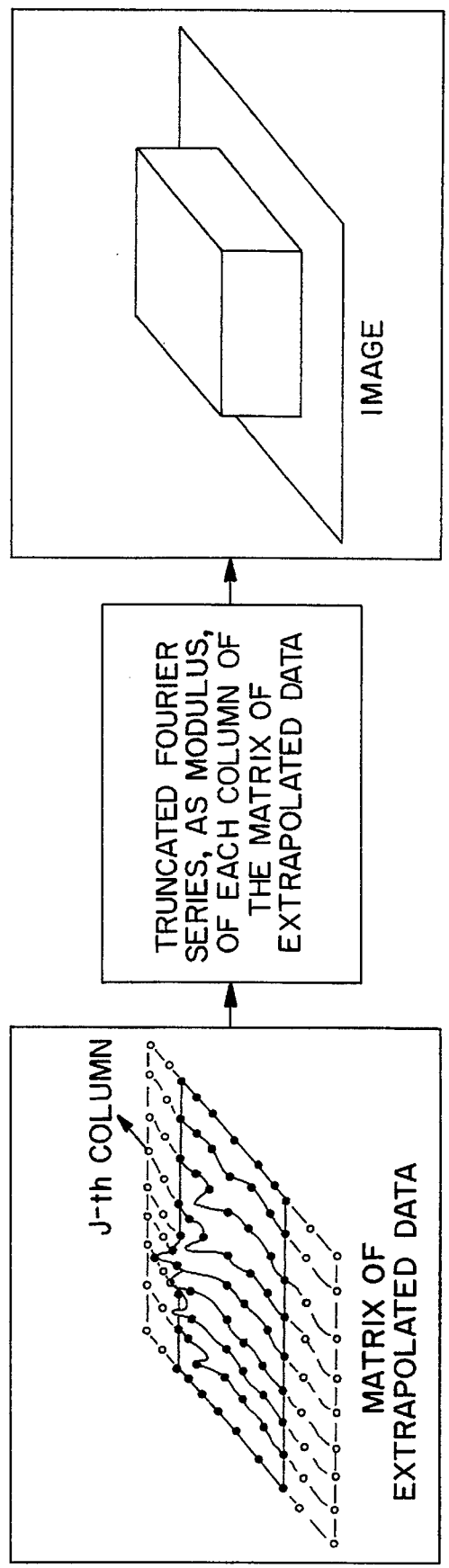

The system operates according to the following steps:
1) the measured data are organized in a matrix for subsequent processing (see FIG. 13);
2) each row of the data matrix is substituted by the corresponding truncated Fourier series (see FIG. 14);
3) each column of the new data matrix is extrapolated independently (see FIG. 15);
4) each column of the extrapolated matrix is substituted by the corresponding truncated Fourier series, in so far as the modulus is concerned; the matrix thus obtained is the MR image (see FIG. 16).

The system presently in use consists in the application of points 1), 2) and 4), therefore the difference between the two methods lies in the presence of stage 3), of extrapolation of the data.

In the document CONTROLS AND COMPUTERS, Col. 15, No. 2, 1987, CANADA, pages 75–79; M. R. Smith & S. T. Nichols, "Magnetic resonance images noise reduction and resolution enhancement using parametric techniques", there is disclosed a method for performing implicitly the extrapolation of the data mentioned above (step 3).

Such a method shows the inconvenience consisting in the fact that the order of the IIR filter is fixed, the number of column data is fixed and there is no control on the number of extrapolated coefficients and consequently this may lead to an uncontrolled propagation of numerical errors.

Moreover spurious spikes may develop in the columns of the MR image obtained but even if it is recognized that these spikes may be avoided, this entails a loss of resolution that is objectionable.

The system and method according to the present invention overcomes such problems.

The specific features of the system and method of the invention are pinpointed in the characterizing clauses of the attached claims.

The extrapolation of the single column in the new data matreix uses an infinite impulse response filter (IIR filter). The data used for extrapolation of each single column are chosen using more than one mode and for each of said modes, a number of choices as to the order of IIR filter used are possible. For each fixed choice of the column data used for extrapolation, and of the order of IIR filter, the system generates a possible candidate to become the extrapolated column. The truncated Fourier series is calculated, in so far as the modulus is concerned, for each candidate, and then a special contrast measurement is evaluated on said series. The candidate corresponding to the maximum contrast will form the column of extrapolated data. The phase of extrapolation of a single column is made up of the following points:

3a) choice of the possible groups of data formcolumn, rcolumn, required to identify the parameters of the IIR filter and choice of the variability interval of the order of filter;

3) identification of the IIR filter parameters and calculation of the impulse response of the filter;

3c) calculation of the truncated Fourier series, in so far as the modulus in concerned, of the extrapolated data;

3d) calculation of a special contrast measurement in the truncated series, in so far as the modulus is concerned;

3e) choice, from among the group of possible extrapolation candidates, of the one having the maximum contrast.

In a distinct version of the method, the number of possible candidates is reduced by mediating the information relating to the different orders of IIR filter. This allows a substantial reduction of the calculation time.

From FIG. 1 it is possible to compare the result obtained from application of the MR image formation method presently used with that obtained using the method according to the present invention. In particular, figures 1a, 1b represent the images formed using the present method, starting from 256 signals and 256 samples, and 64 signals and 256 samples, respectively, while in figures 1c, 1d are shown the images obtained, starting from 64 signals and 256 samples, using the basic version and the modified version of the method according to the present invention, respectively.

List of figures

FIG. 1: Illustration of the results obtained by applying the MR imaging method presently in use, and that forming the object of the present invention.

FIG. 1a: Image formed using the method in use, starting from 256 signals and 256 samples.

FIG. 1b: Image formed using the method in use, starting from 64 signals and 256 samples.

FIG. 1c: Image obtained using the basic version of the method according to the present invention, starting from 64 signals and 256 samples.

FIG. 1d: Image obtained using the modified version of the method according to the invention, starting from 64 signals and 256 samples.

FIG. 2: Illustration of a subject during an MR examination: the cylinder around the subject represents the magnet which generates the static and homogeneous field $H_O$; the arrows mark direction, sense and intensity of the static and homogeneous field.

Figure 3:
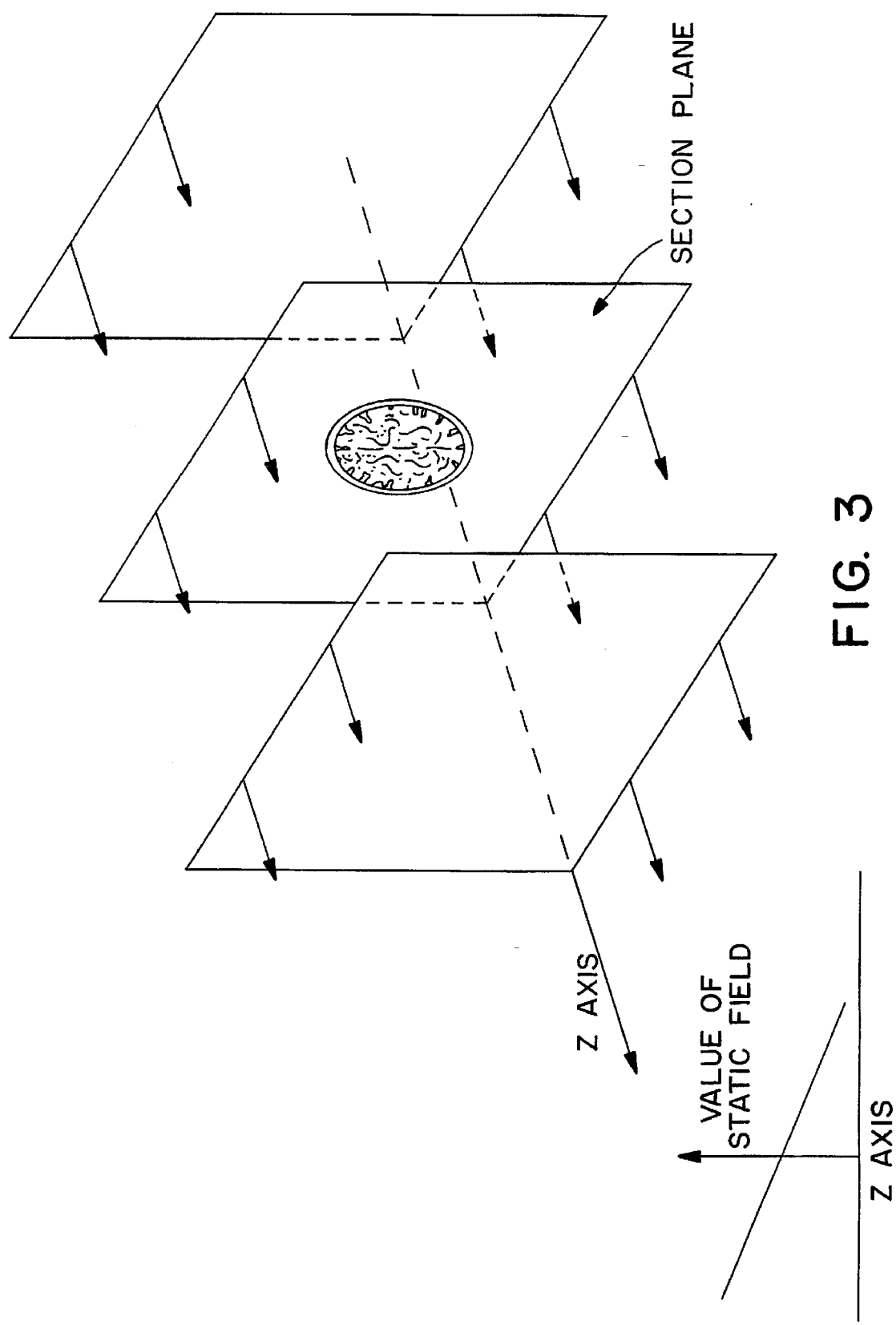

FIG. 3: Representation of the static field during application of the radio frequency impulse: the arrows indicate direction, sense and intensity of the static field. In the graph at the side, the progress of the value of the static field as a function of the level compared with the plane of the cross-section can be observed.

Figure 4:
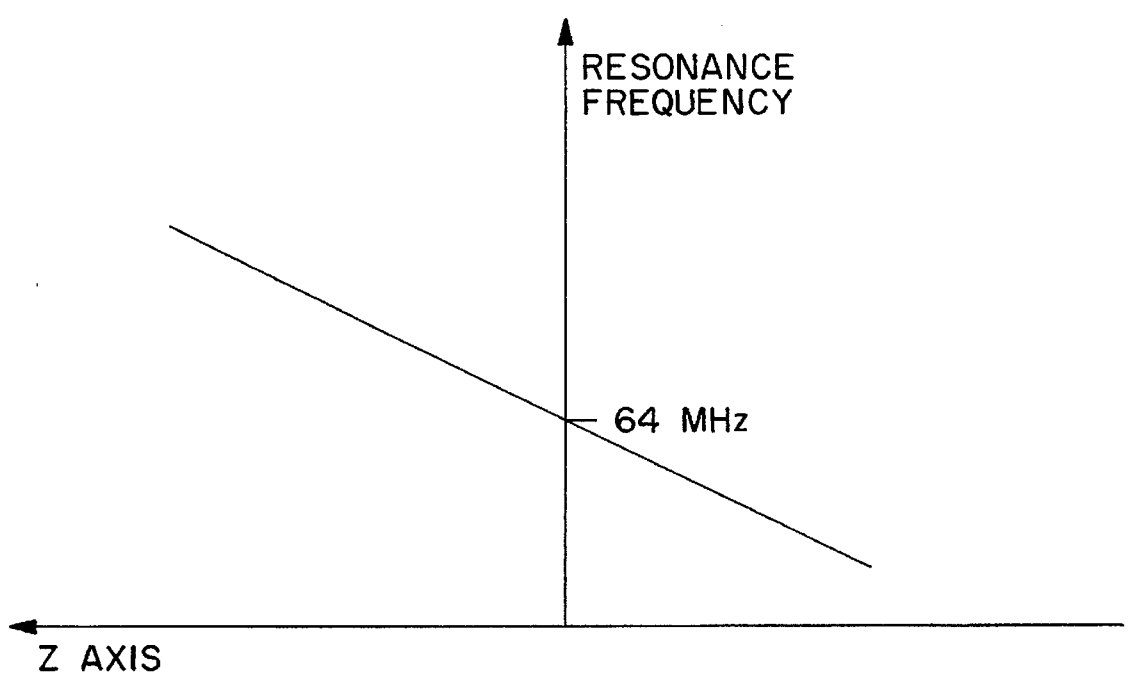

FIG. 4: Progress of the resonance frequency, during the radio frequency impulse, in the presence of a gradient in the static field.

Figure 5:
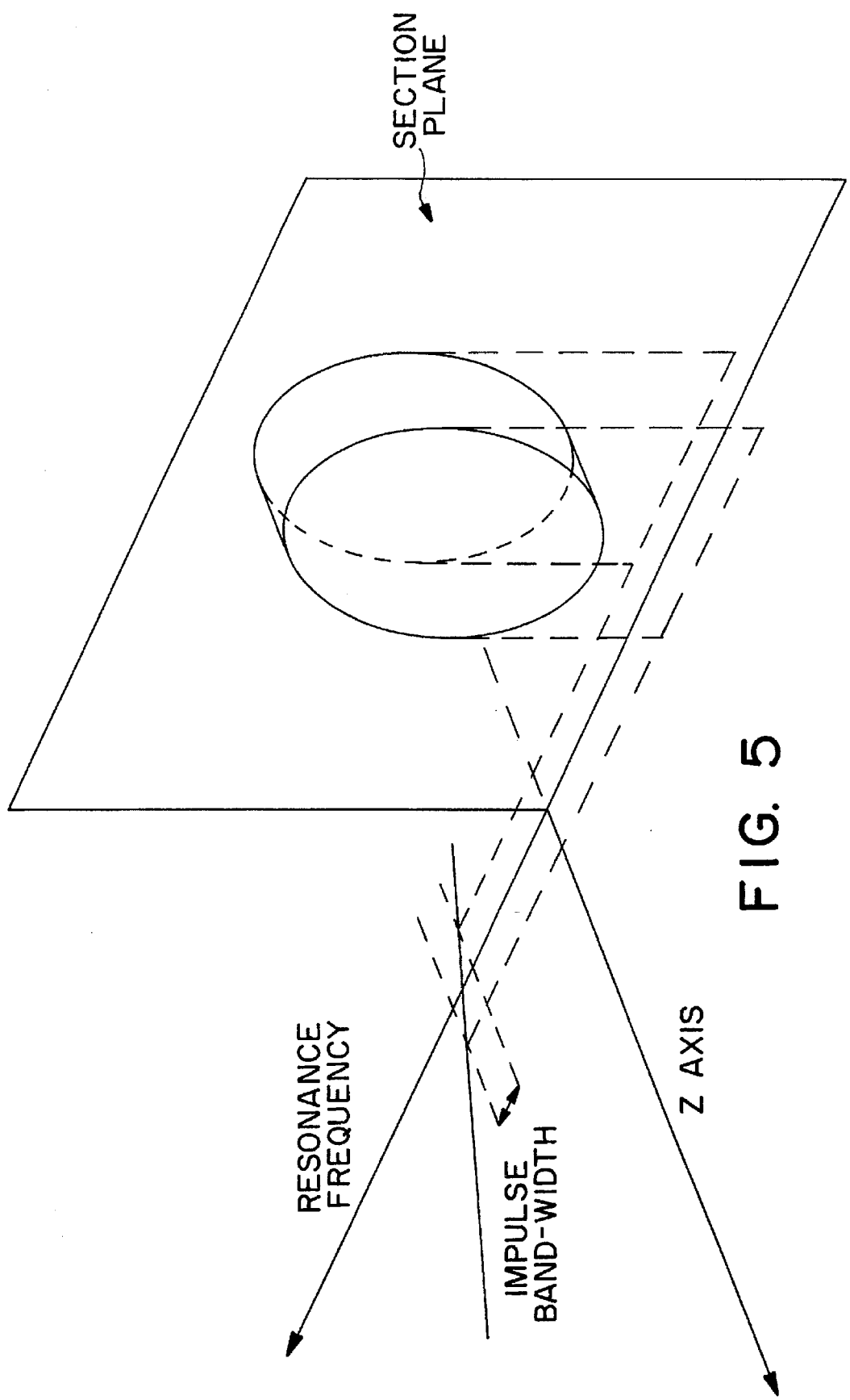

FIG. 5: Illustration of the portion of space in which the nuclei of the object under examination are excited by the radio frequency impulse.

FIG. 6: Frequency spectrum of the signal emitted by the nuclei in the presence of the static and homogeneous field alone.

Figure 7:
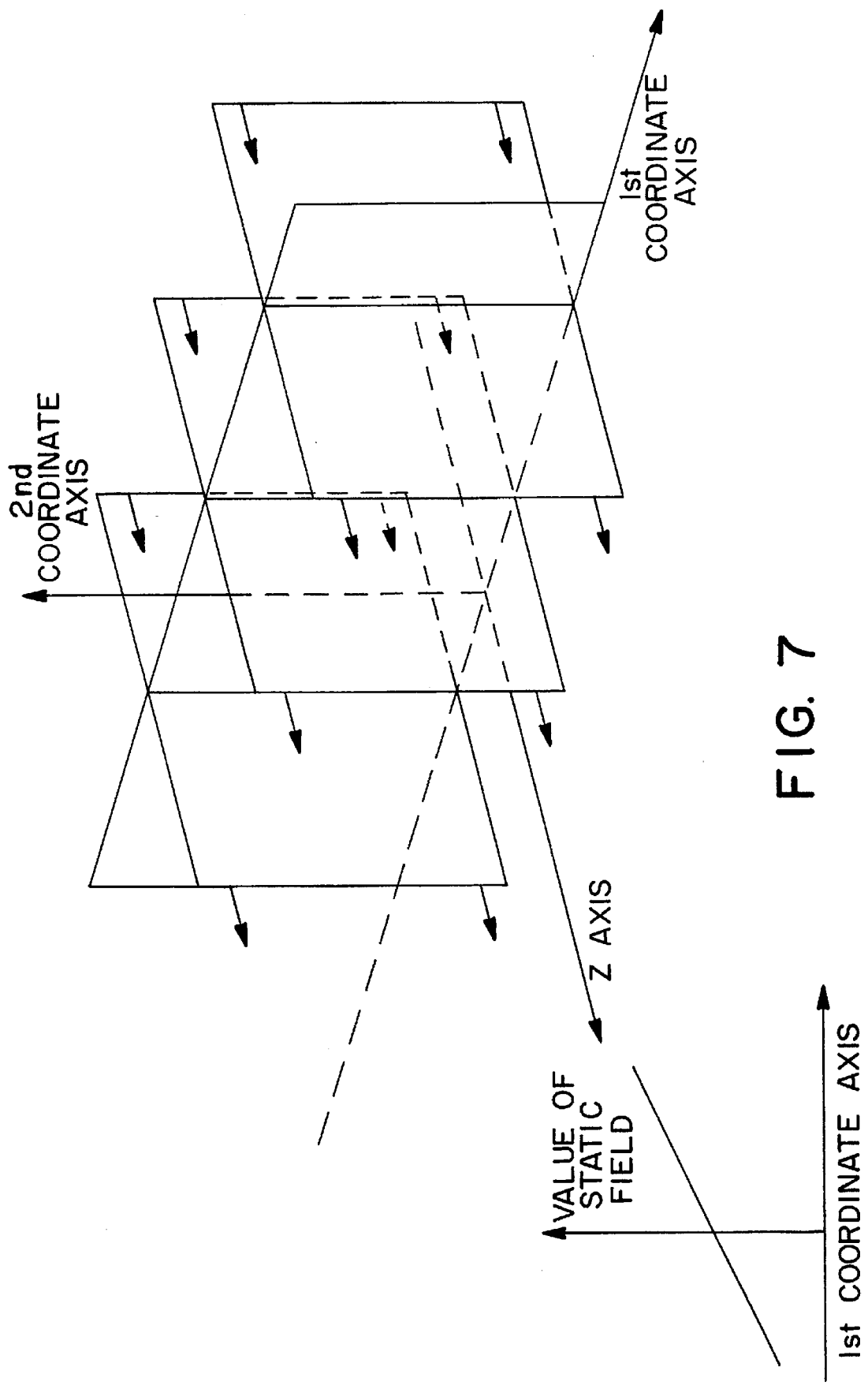

FIG. 7: Representation of the static field during the acquisition stage in the presence of a gradient in the static field: the arrows indicate direction, sense and intensity of the static field. In the graph at the side, progress of the value of the static field as a function of the first coordinate on the plane of the cross-section can be seen.

Figure 8:
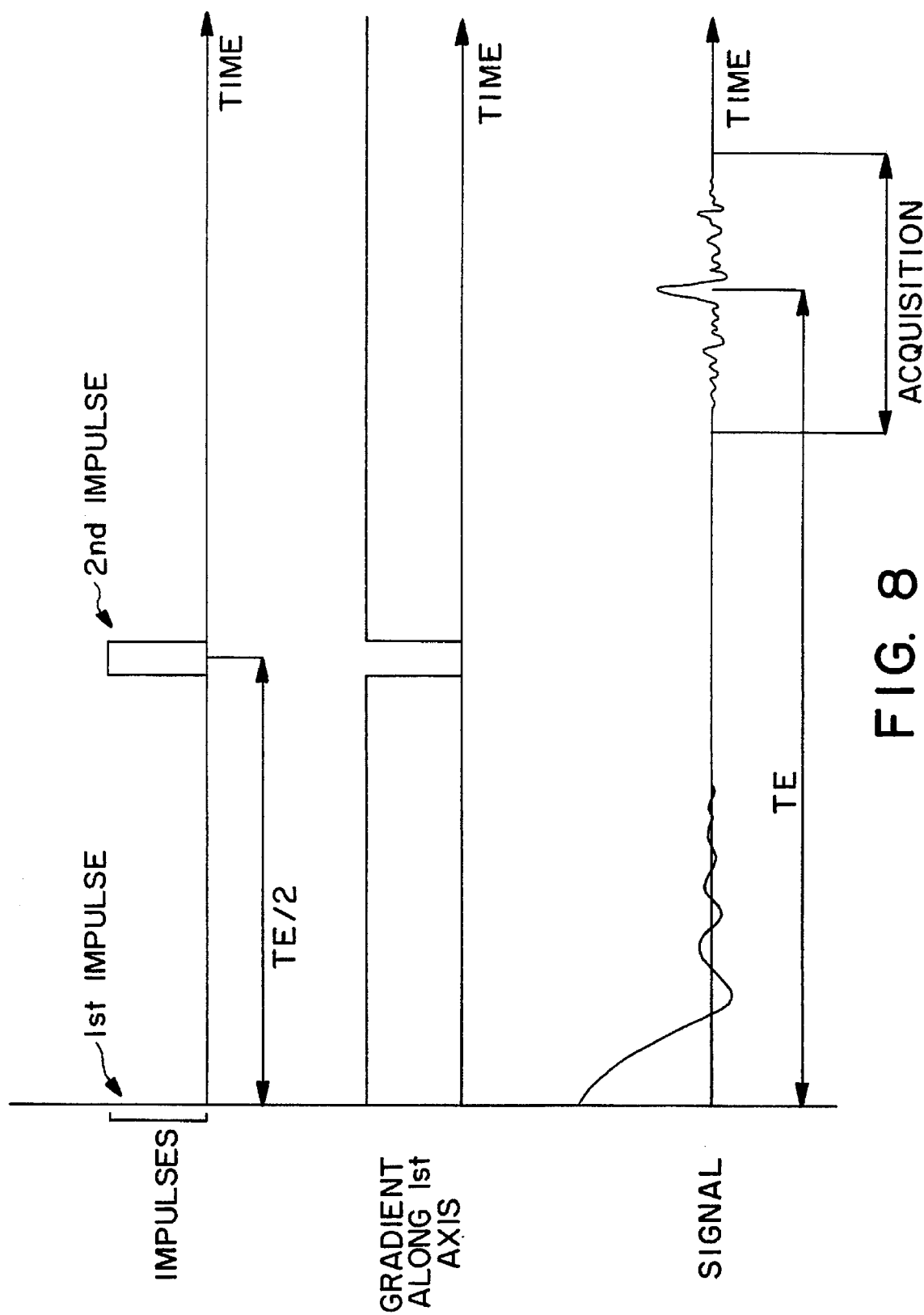

FIG. 8: Progress in time of the impulses and of the gradient in the static field, along the first coordinate axis of the plane of the cross-section, used to form the measured signal.

FIG. 9: Representation of the static field during the stage between the first and the second impulse: the arrows indicate direction, sense and intensity of the static field. In the graph to the side, the progress of the value of the static field as a function of the second coordinate on the plane of the cross-section can be seen.

FIG. 10: Illustration of the consecutive repetition of the process for acquisition of the signal: between one repetition and the next, the only variation is in the value of the gradient along the second coordinate axis and, consequently, the form of the signal measured.

Figure 11:
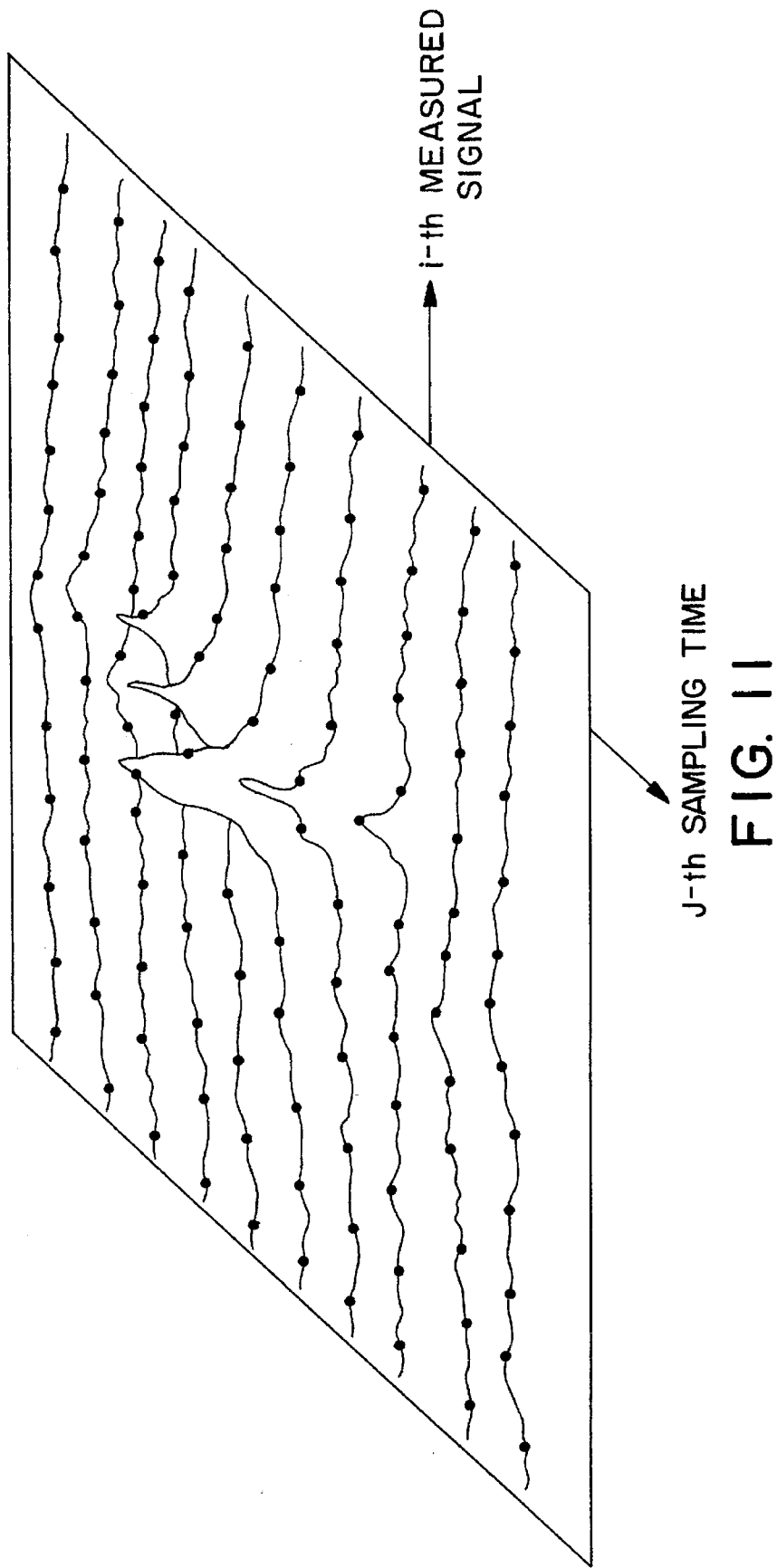

FIG. 11: Representation of one of the two components of the measured signal as a function of the signal sampling time and the value of the gradient along the second coordinate axis.

Figure 12A:
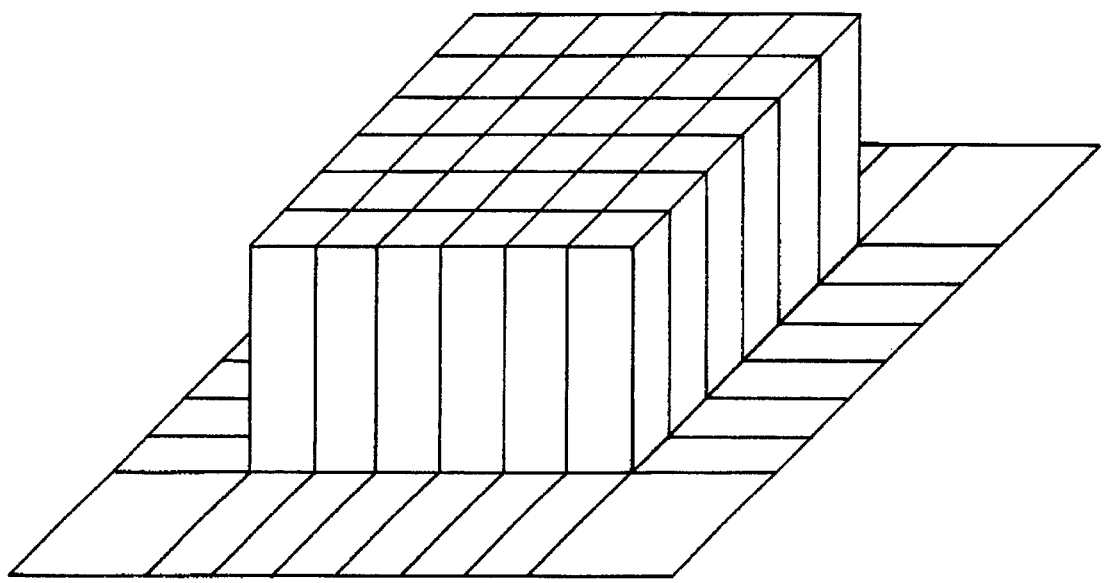
Figure 12B:
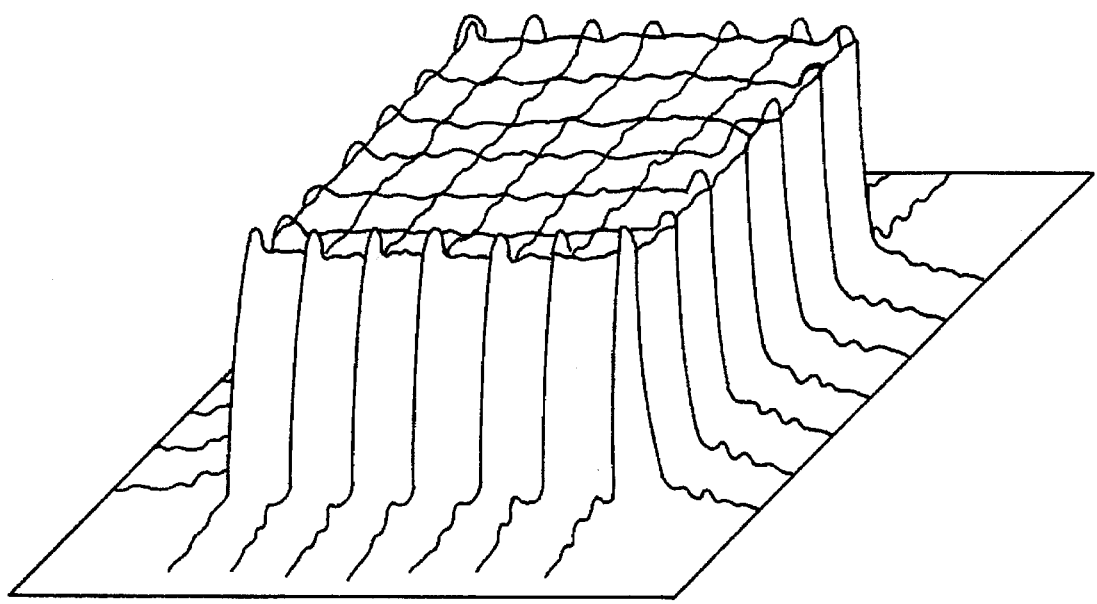

FIG. 12: True image (top), image showing the presence of truncation artifacts (bottom).

Figure 13:
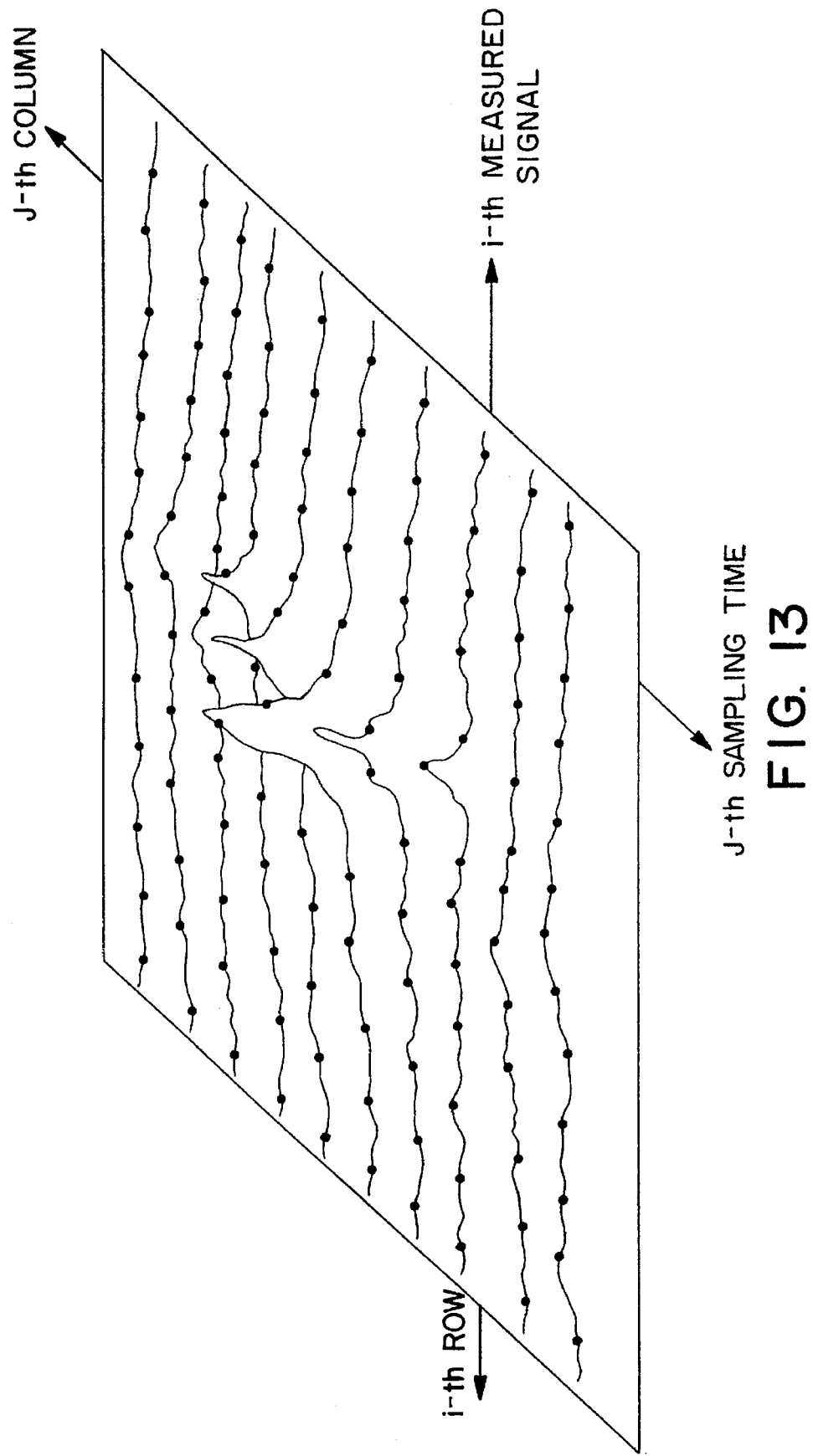

FIG. 13: Representation of the measured data matrix.

Figure 14:
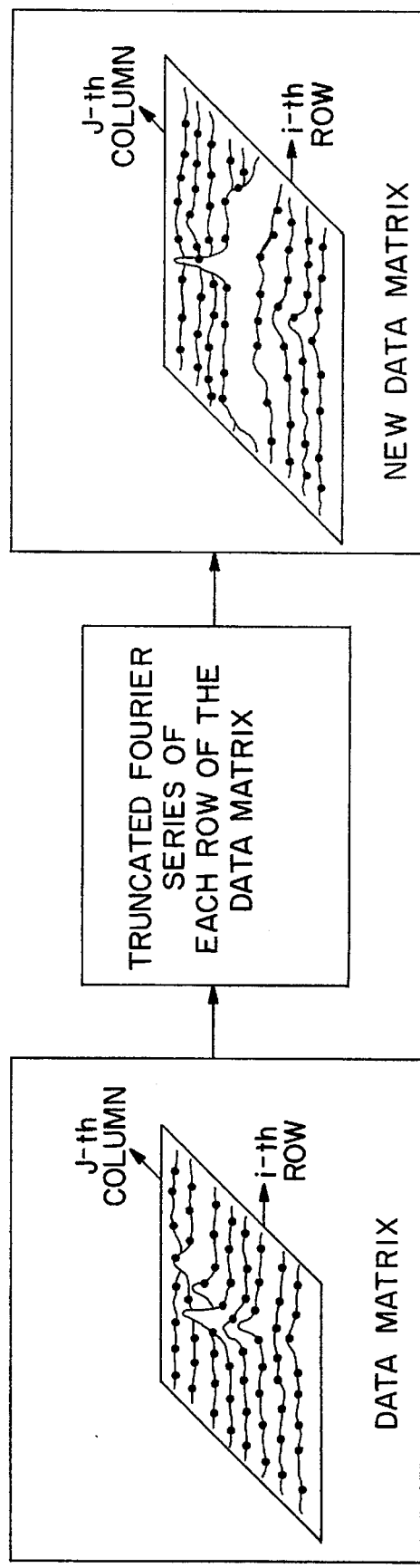

FIG. 14: Representation of application of the truncated Fourier series to the rows of the measured data matrix.

FIG. 15: Representation of the extrapolation, along the columns, of the new data matrix.

FIG. 16: Representation of application of the truncated Fourier series, in so far as the modulus is concerned, to the columns of the extrapolated data matrix.

Figure 17:
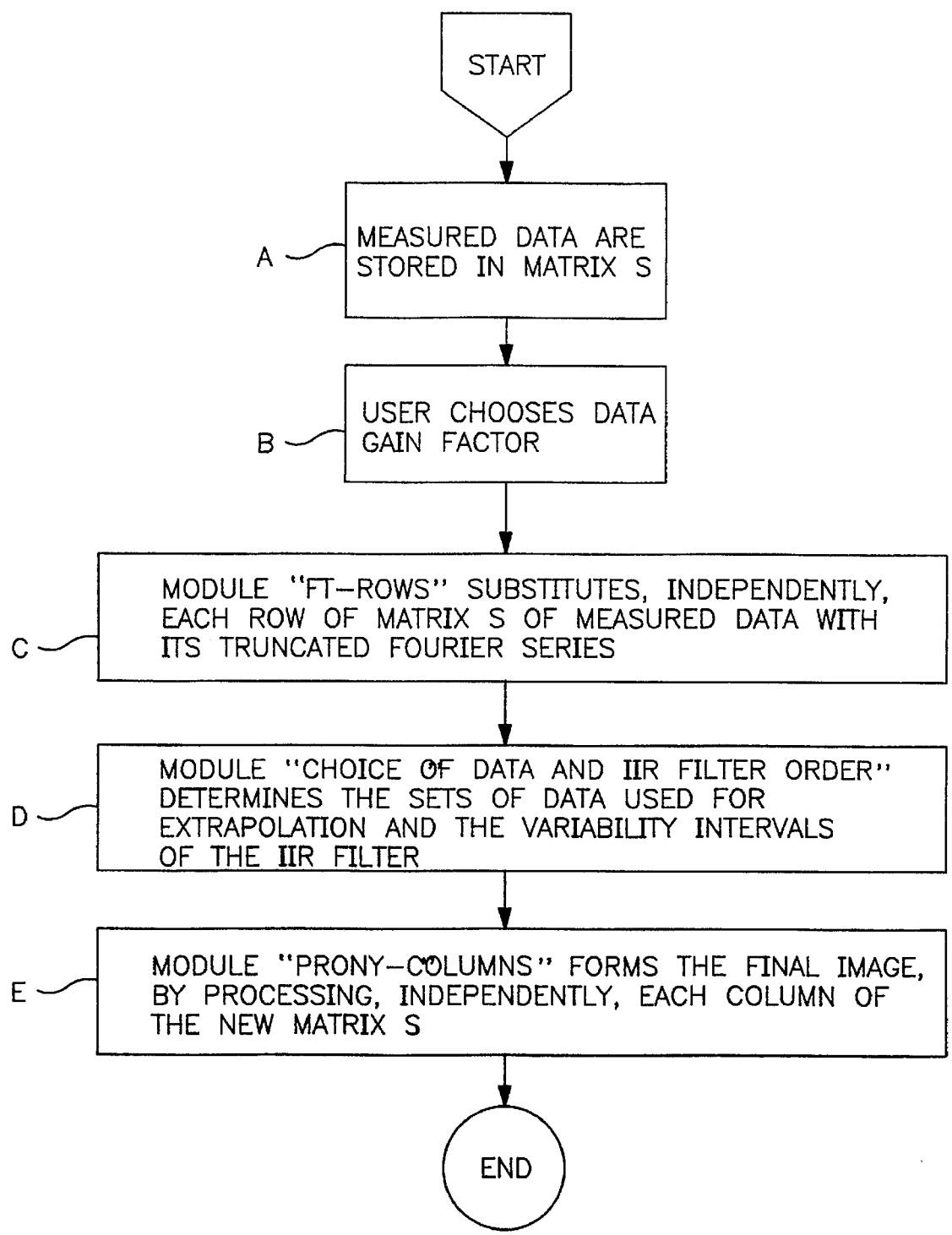

FIG. 17: Flow diagram for the method object of the invention.

Figure 18:
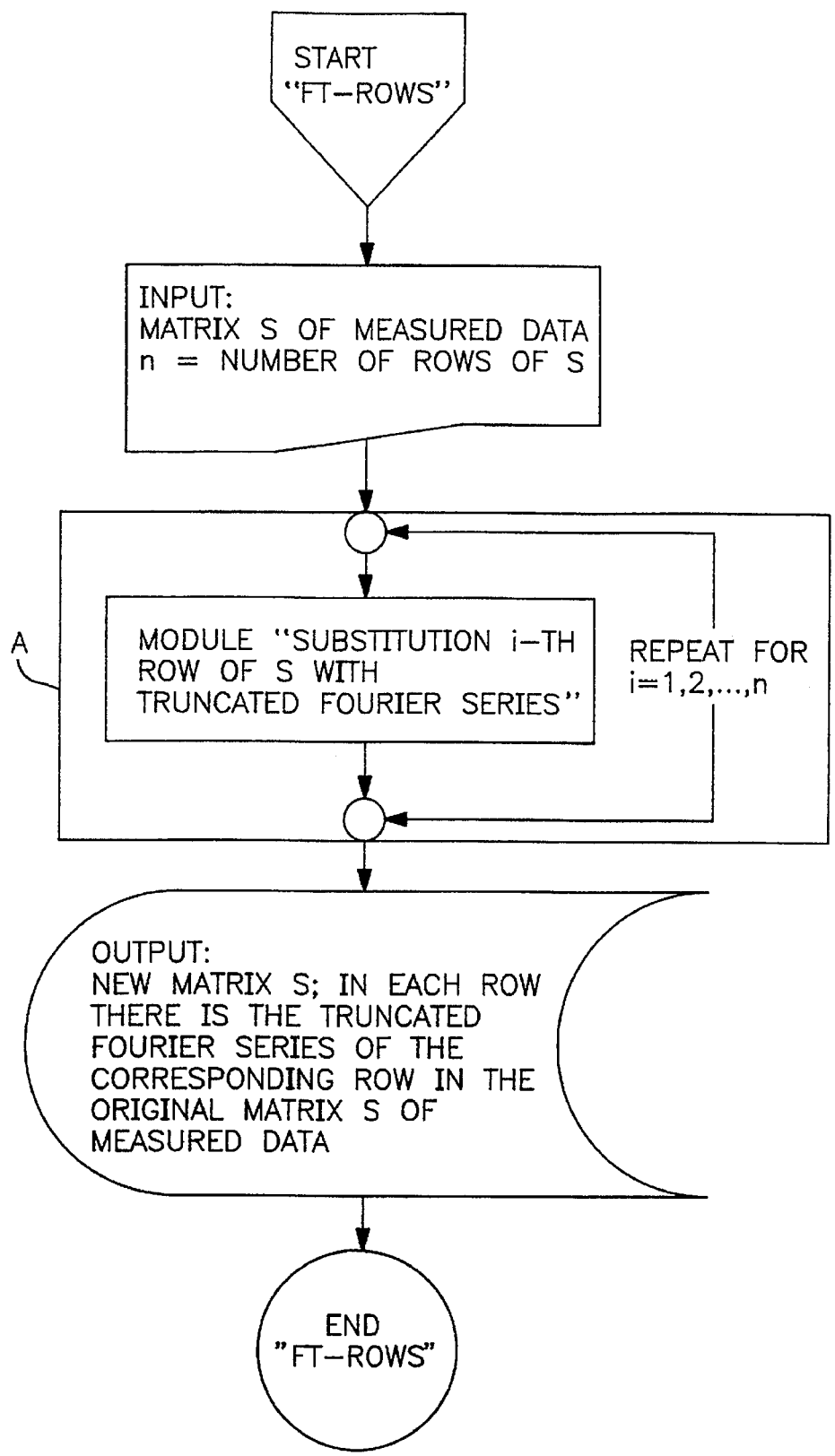

FIG. 18: Flow diagram for the "FT-ROWS" module.

Figure 19:
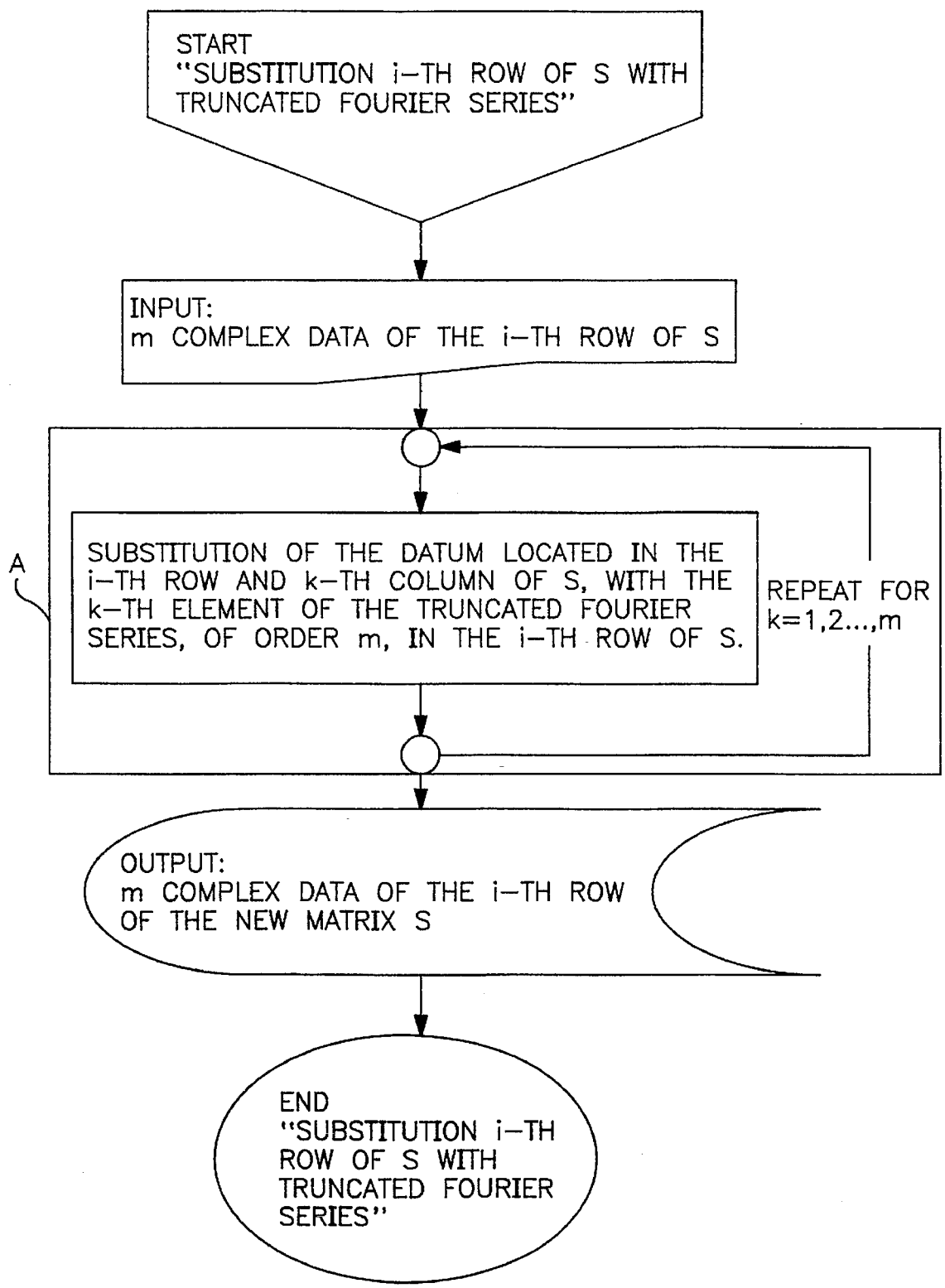

FIG. 19: flow diagram for the module "SUBSTITUTION OF THE i-TH ROW OF S WITH TRUNCATED FOURIER SERIES".

Figure 20:
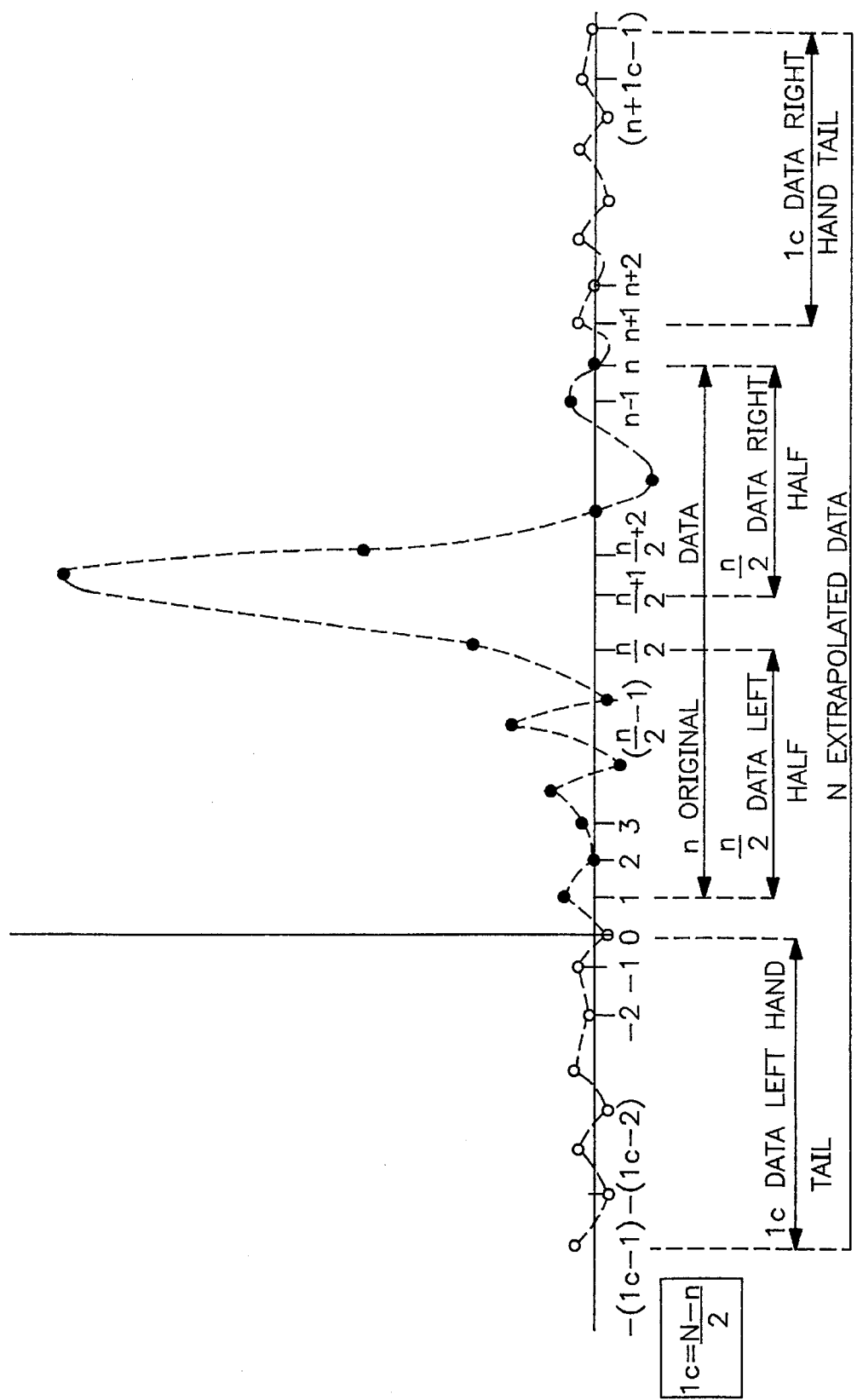

FIG. 20: Representation of the data in a generic column of the new data matrix, used for its extrapolation.

Figure 21:
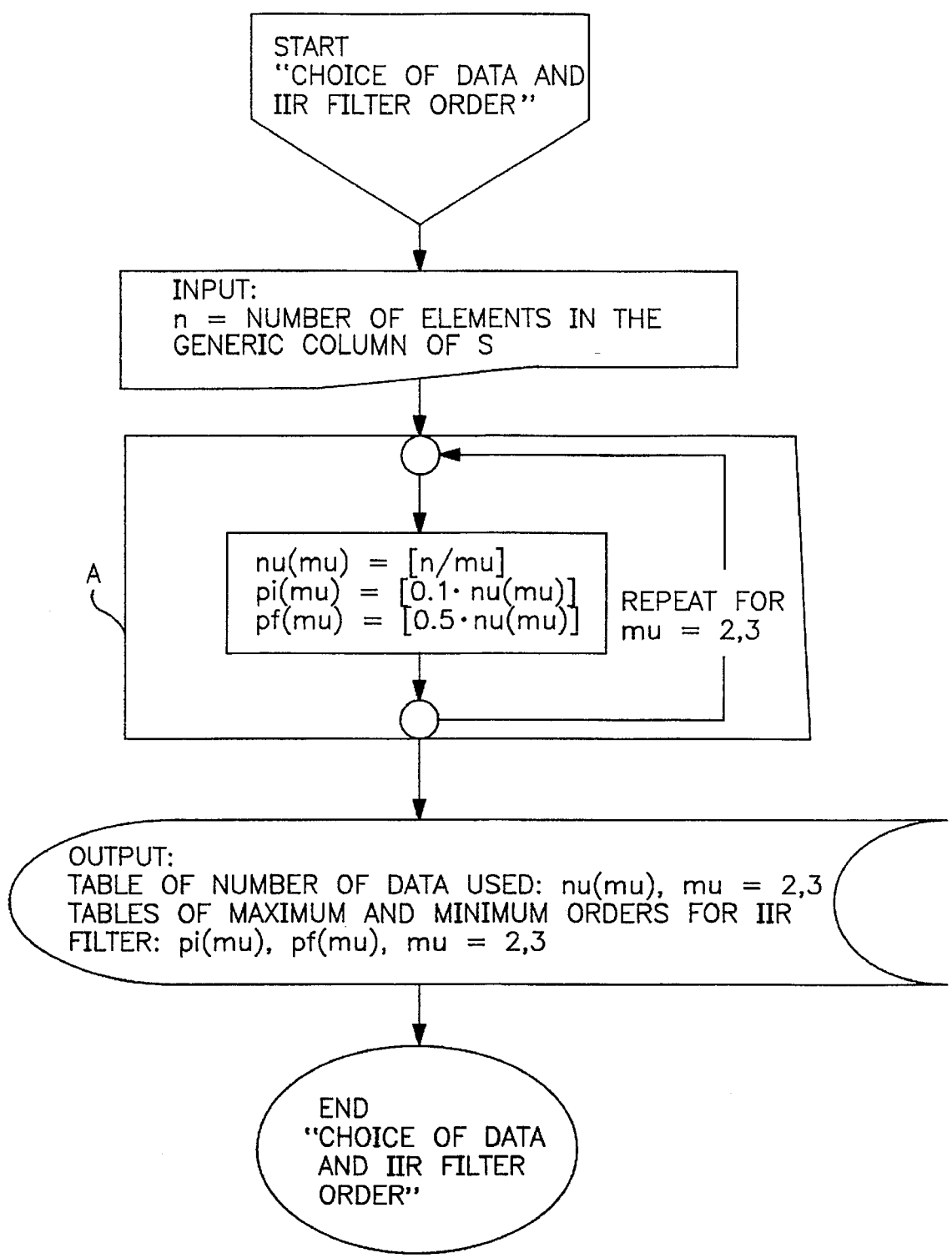

FIG. 21: Flow diagram for the module "CHOICE OF DATA AND IIR FILTER ORDER".

Figure 22:
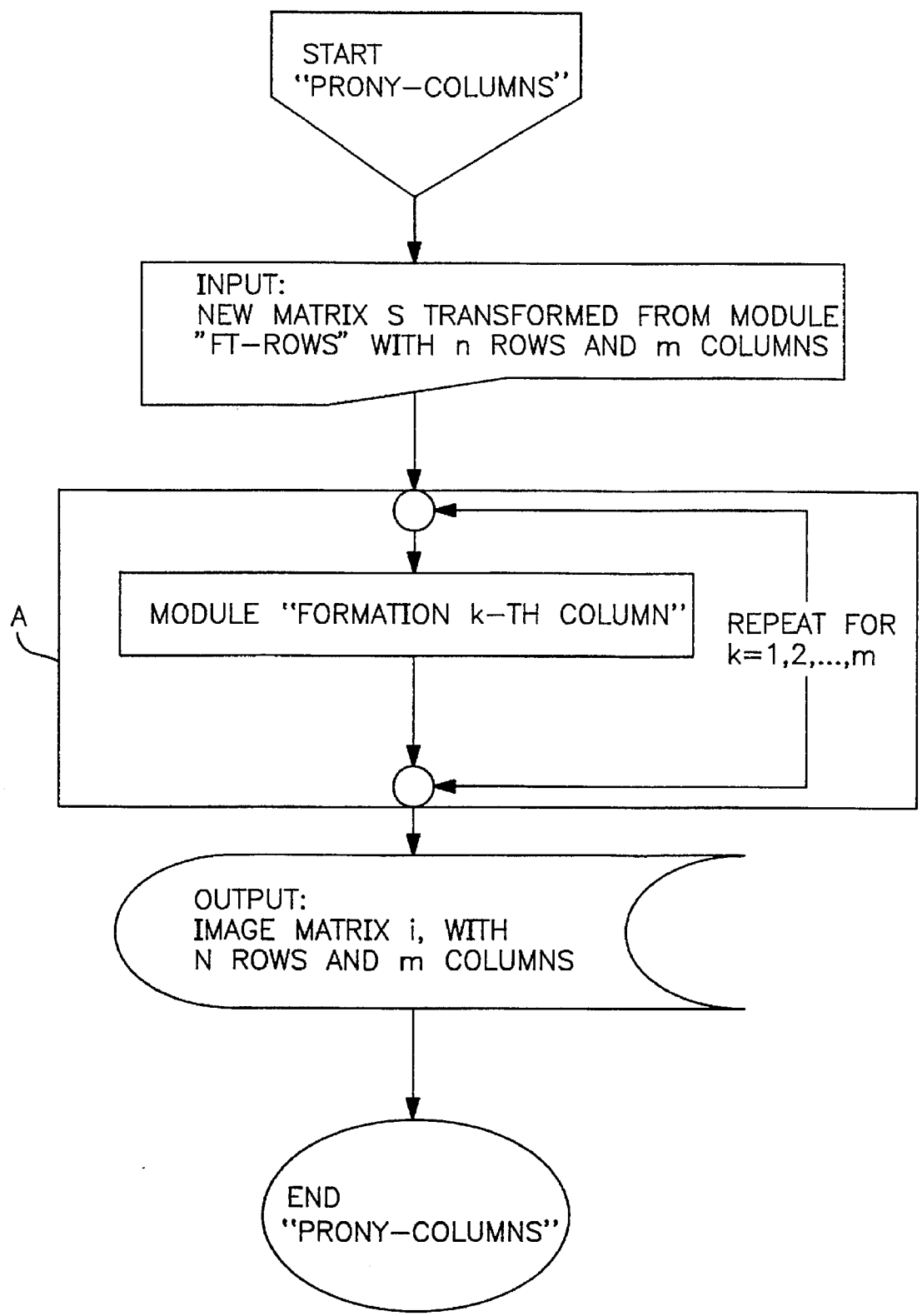

FIG. 22: Flow diagram for the module "PRONY-COLUMNS".

FIG. 23: Flow diagram for the module "FORMATION OF k-TH COLUMN".

Figure 23A:
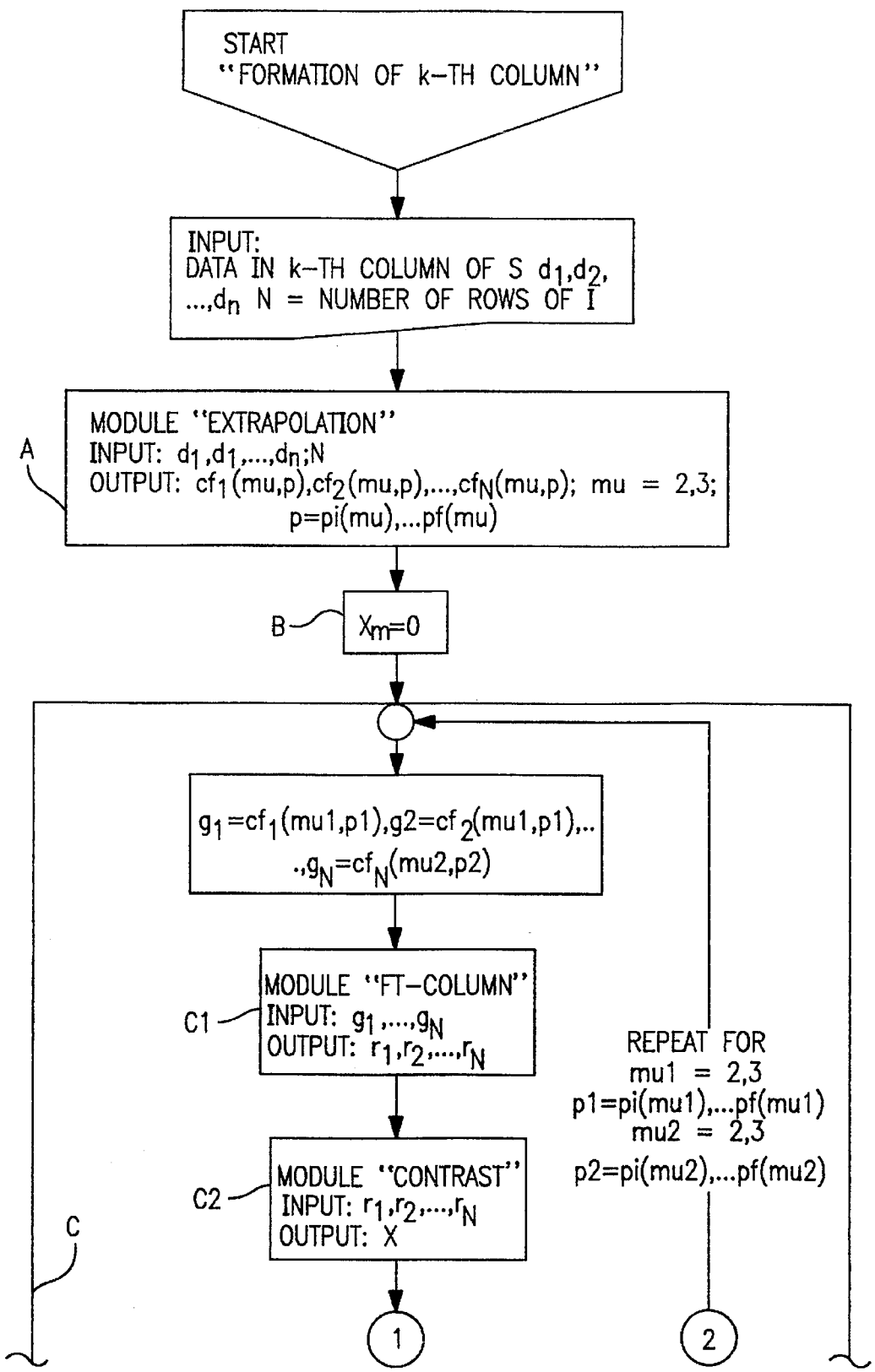
Figure 23B:
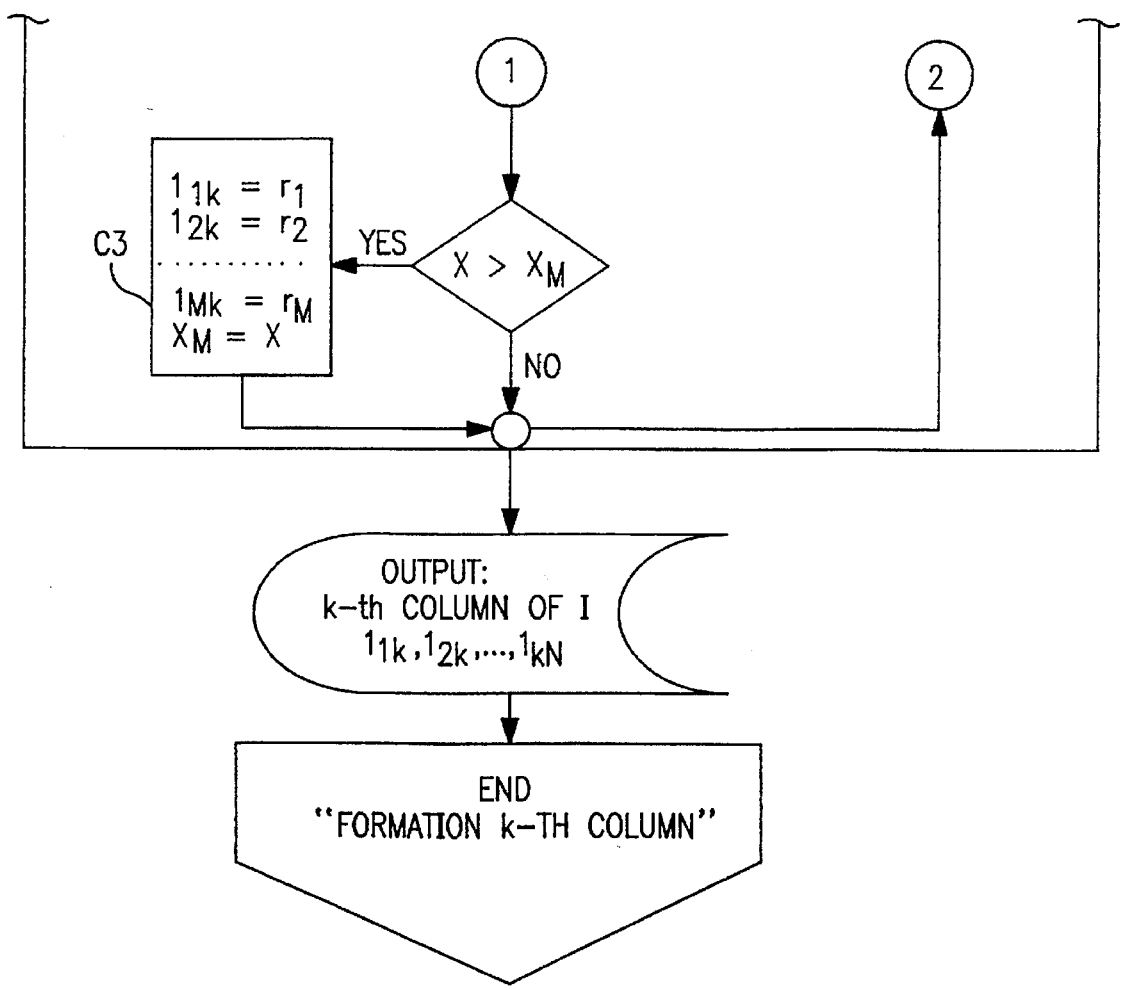
Figure 23C:
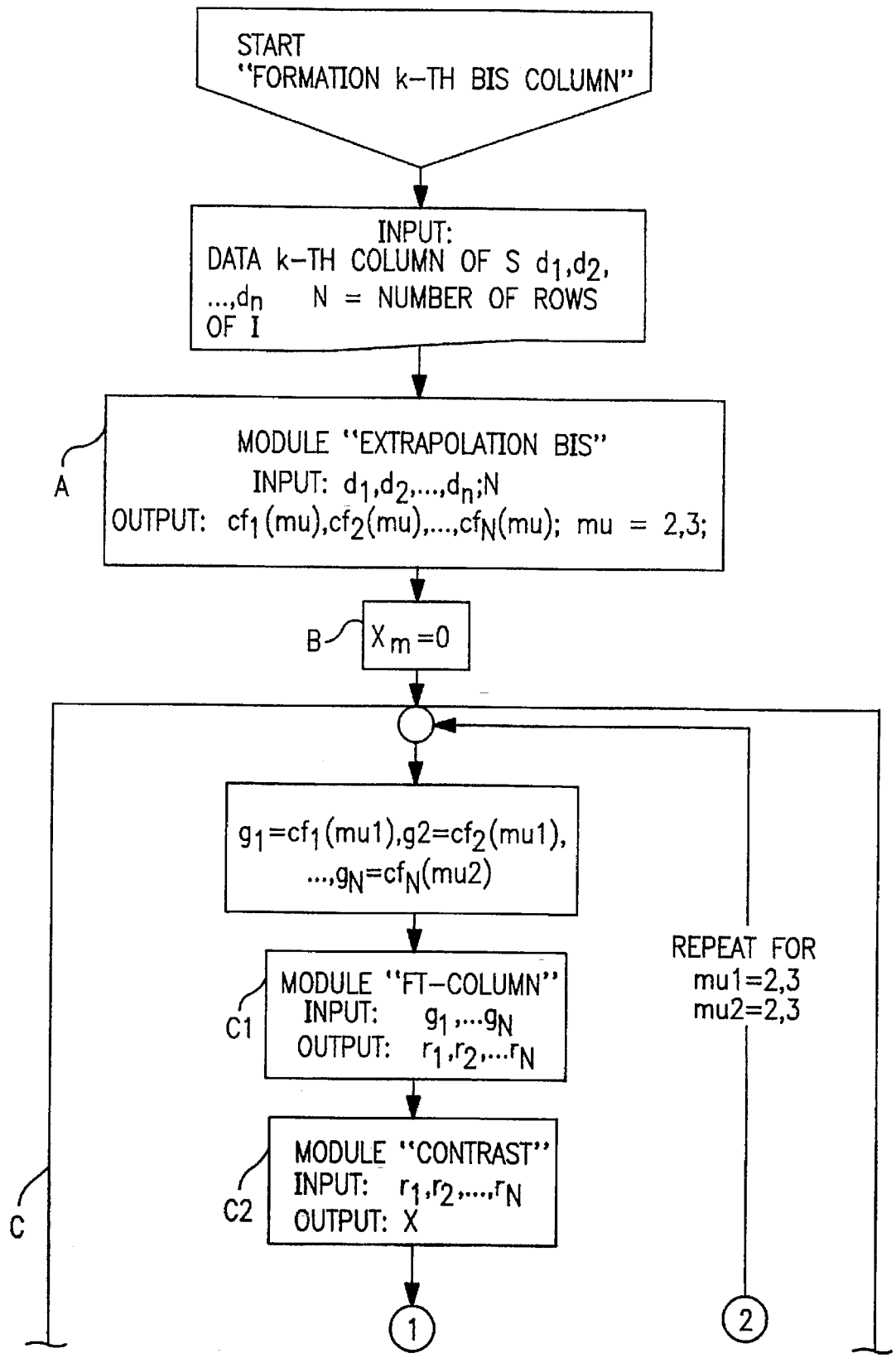
Figure 23D:
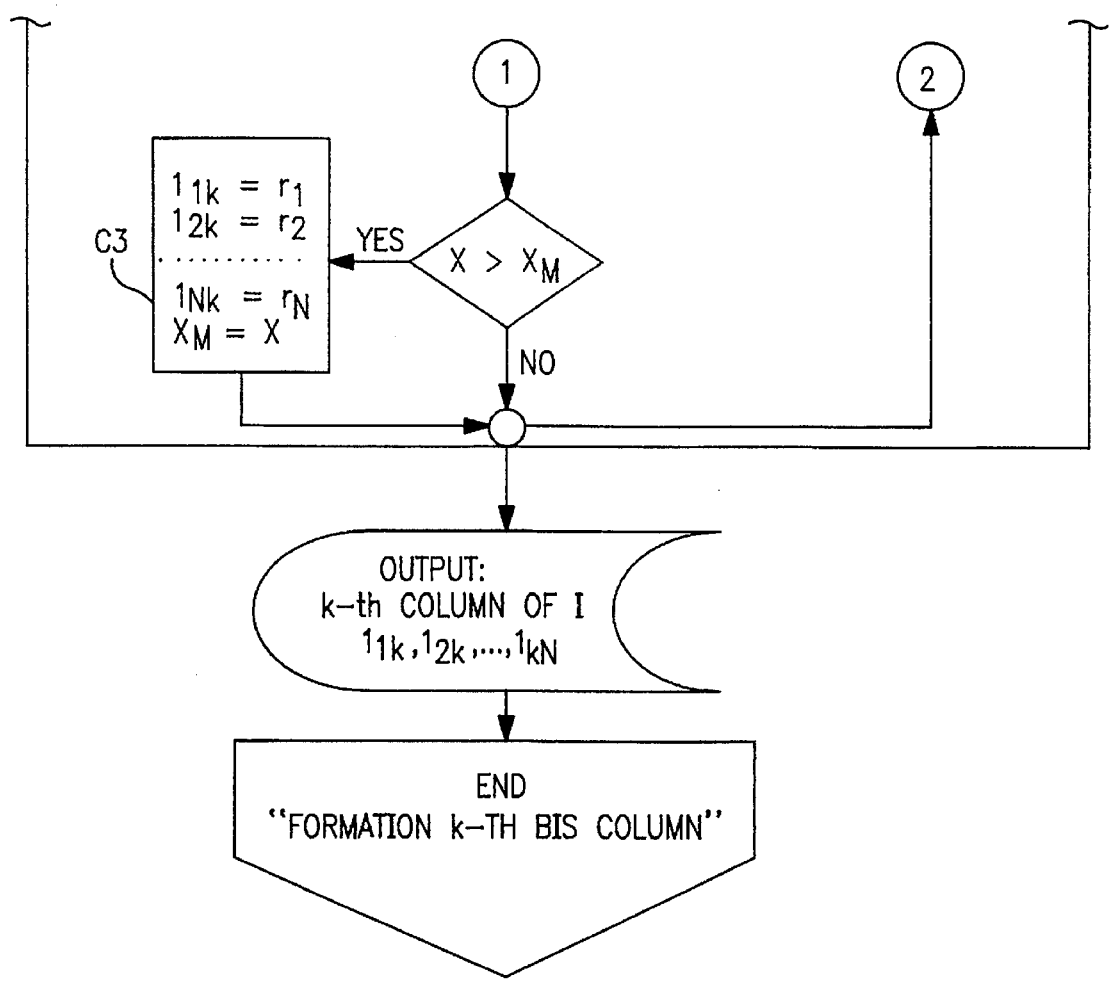

FIG. 23bis: Flow diagram for the module "FORMATION OF k-TH BIS COLUMN".

FIG. 24: Flow diagram for the module "EXTRAPOLATION".

Figure 24A:
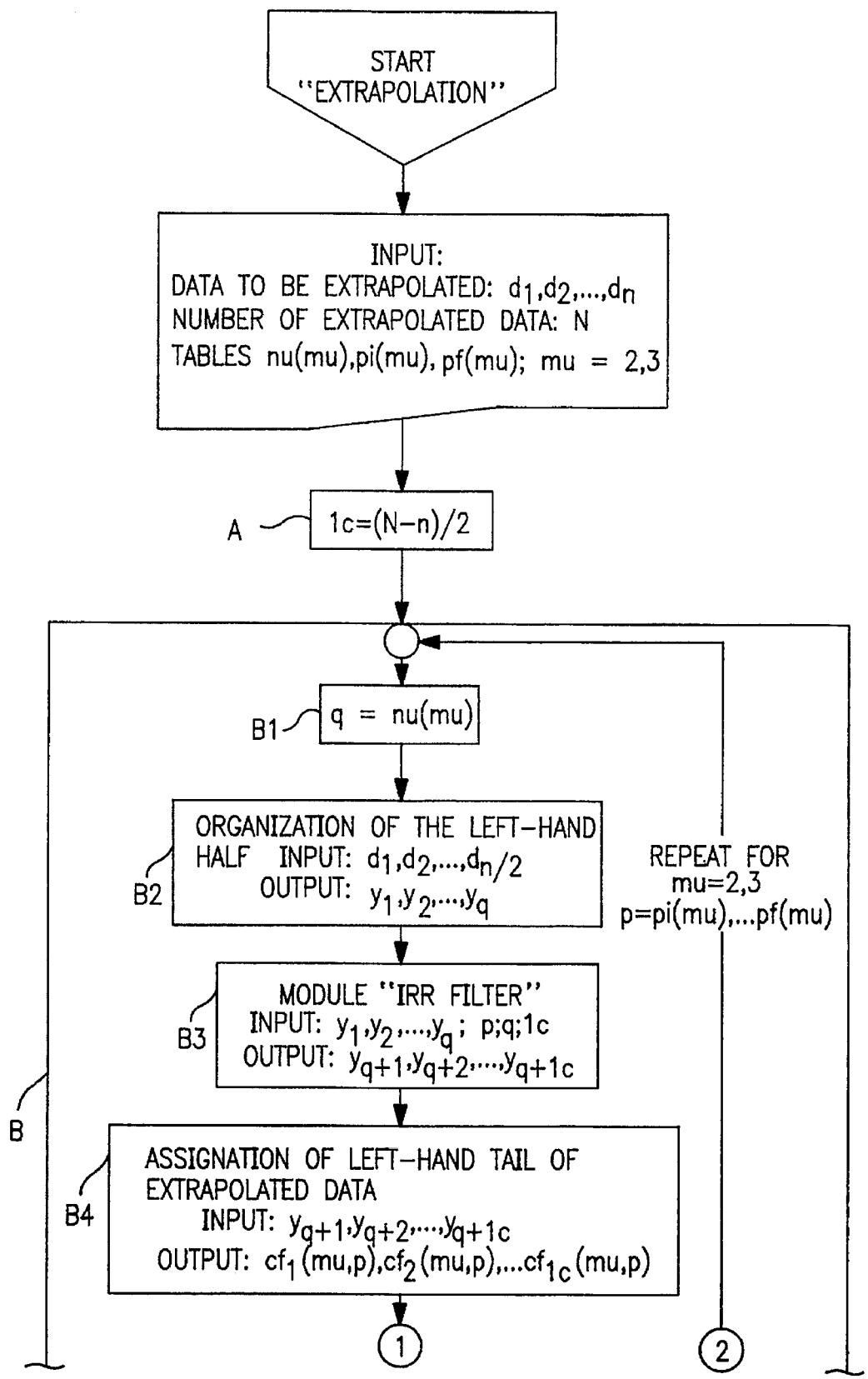
Figure 24B:
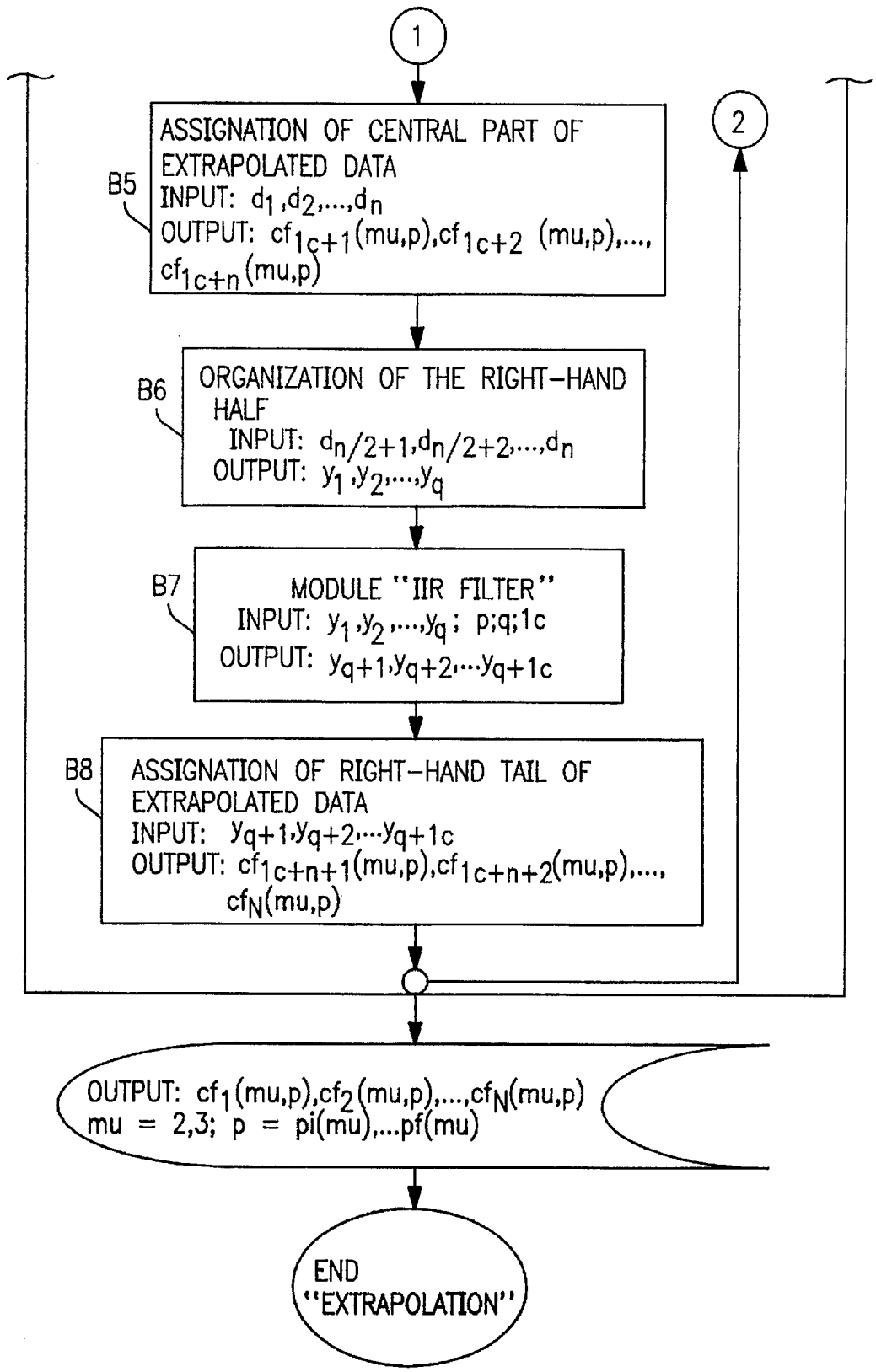
Figure 24C:
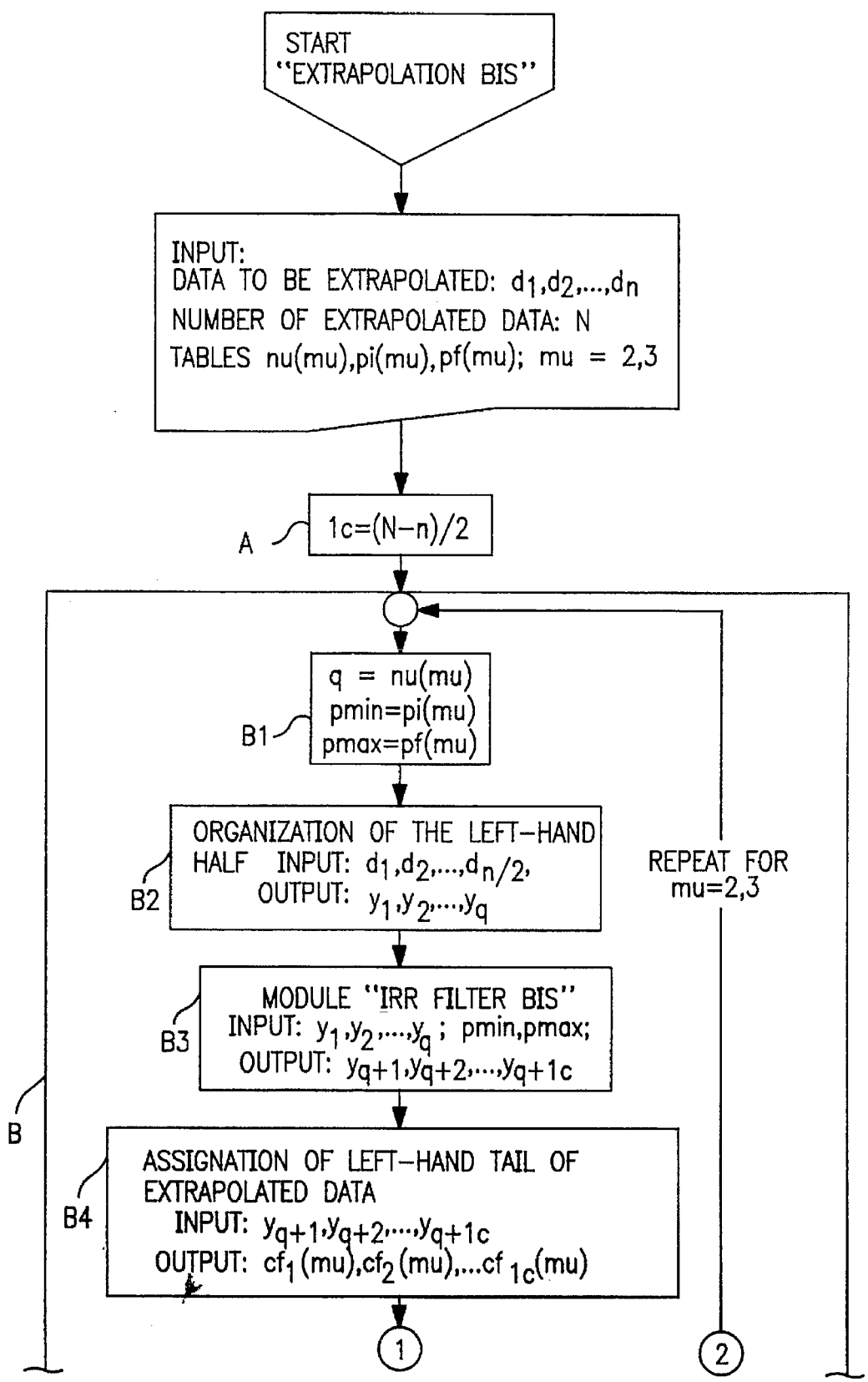
Figure 24D:
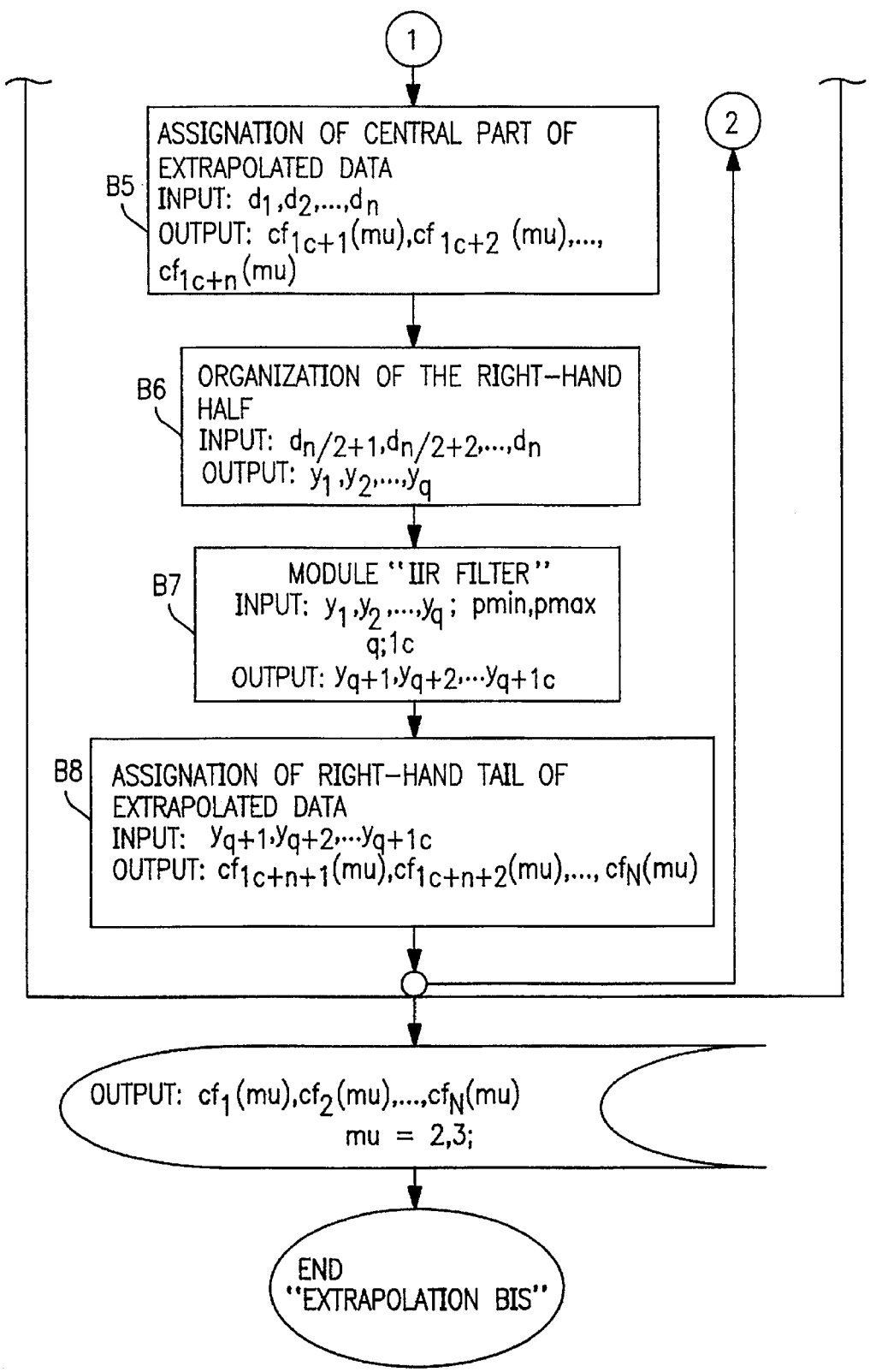

FIG. 24bis: Flow diagram for the module "EXTRAPOLATION BIS".

Figure 25A:
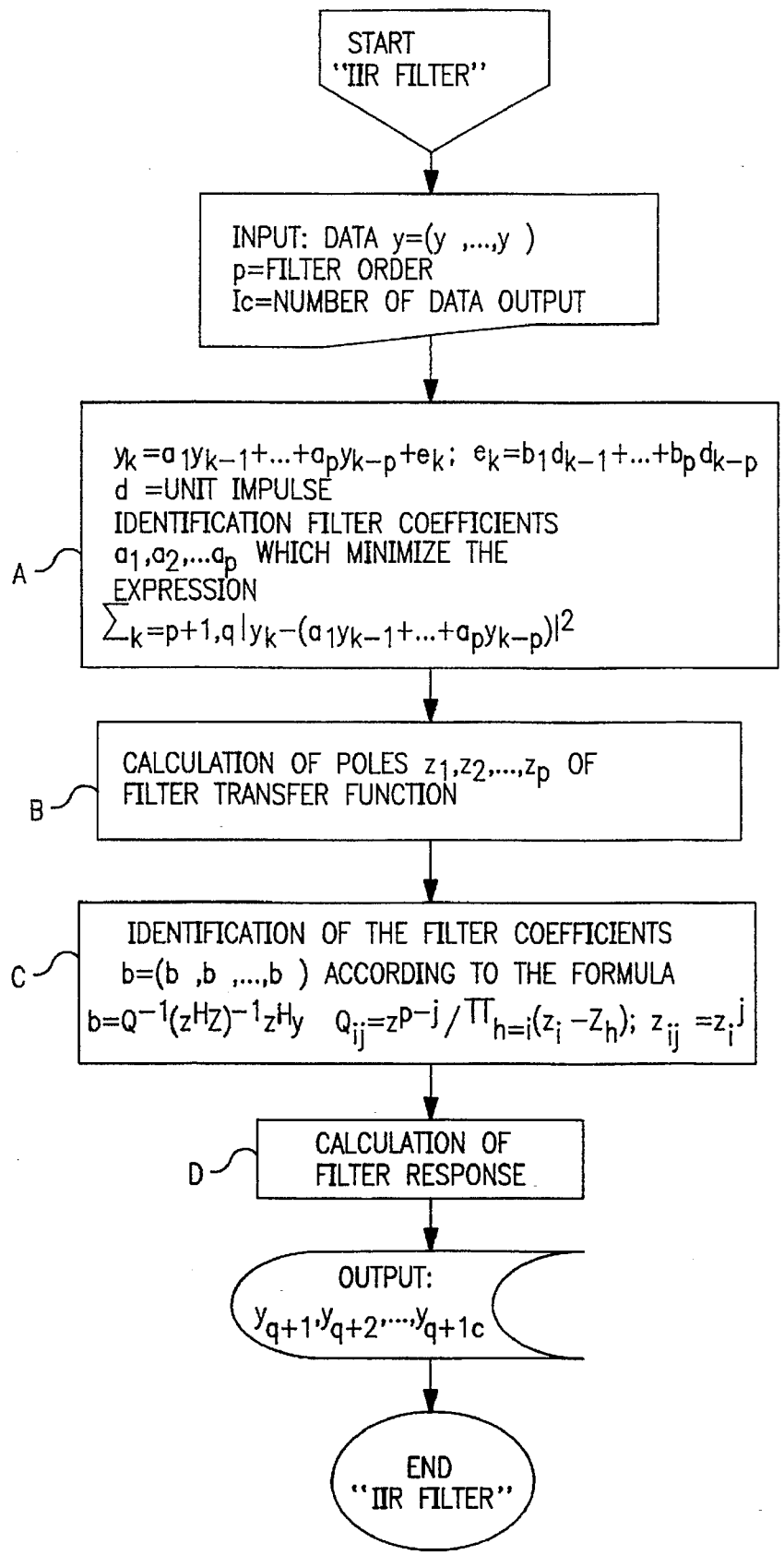
Figure 25B:
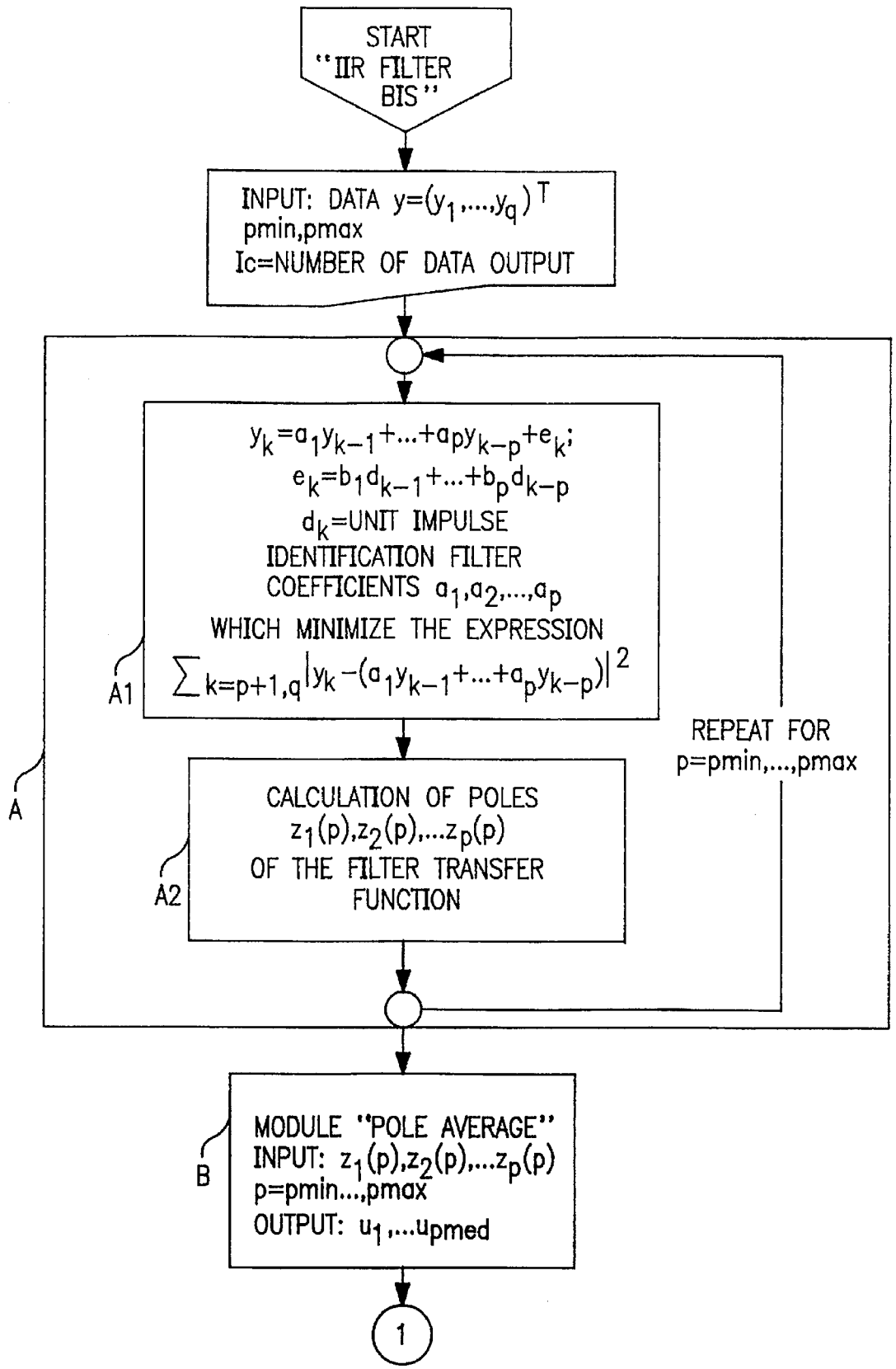
Figure 25C:
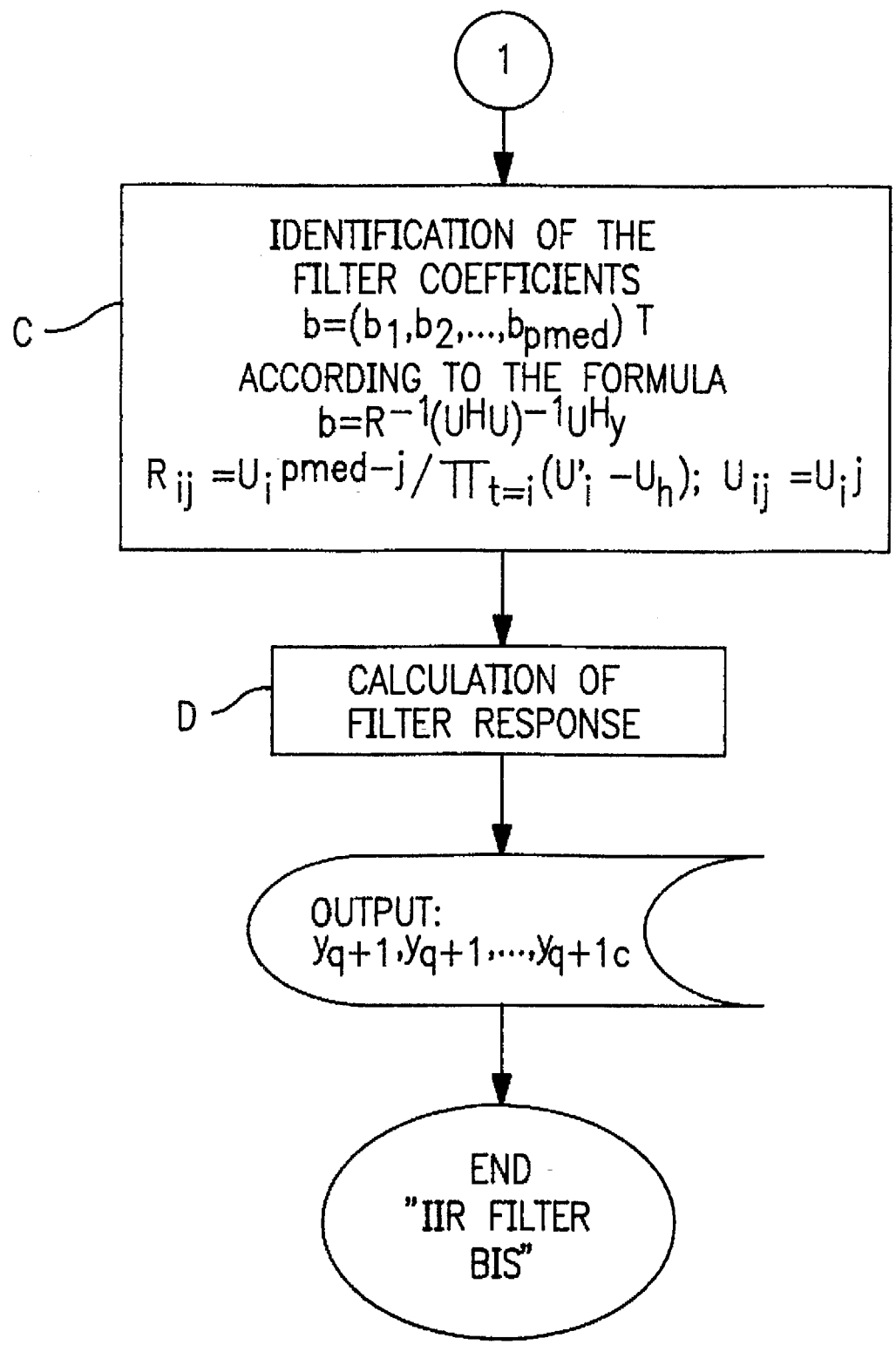

FIG. 25: Flow diagram for the module "IIR FILTER".

FIG. 25bis: Flow diagram for the module "IIR FILTER BIS".

Figure 26A:
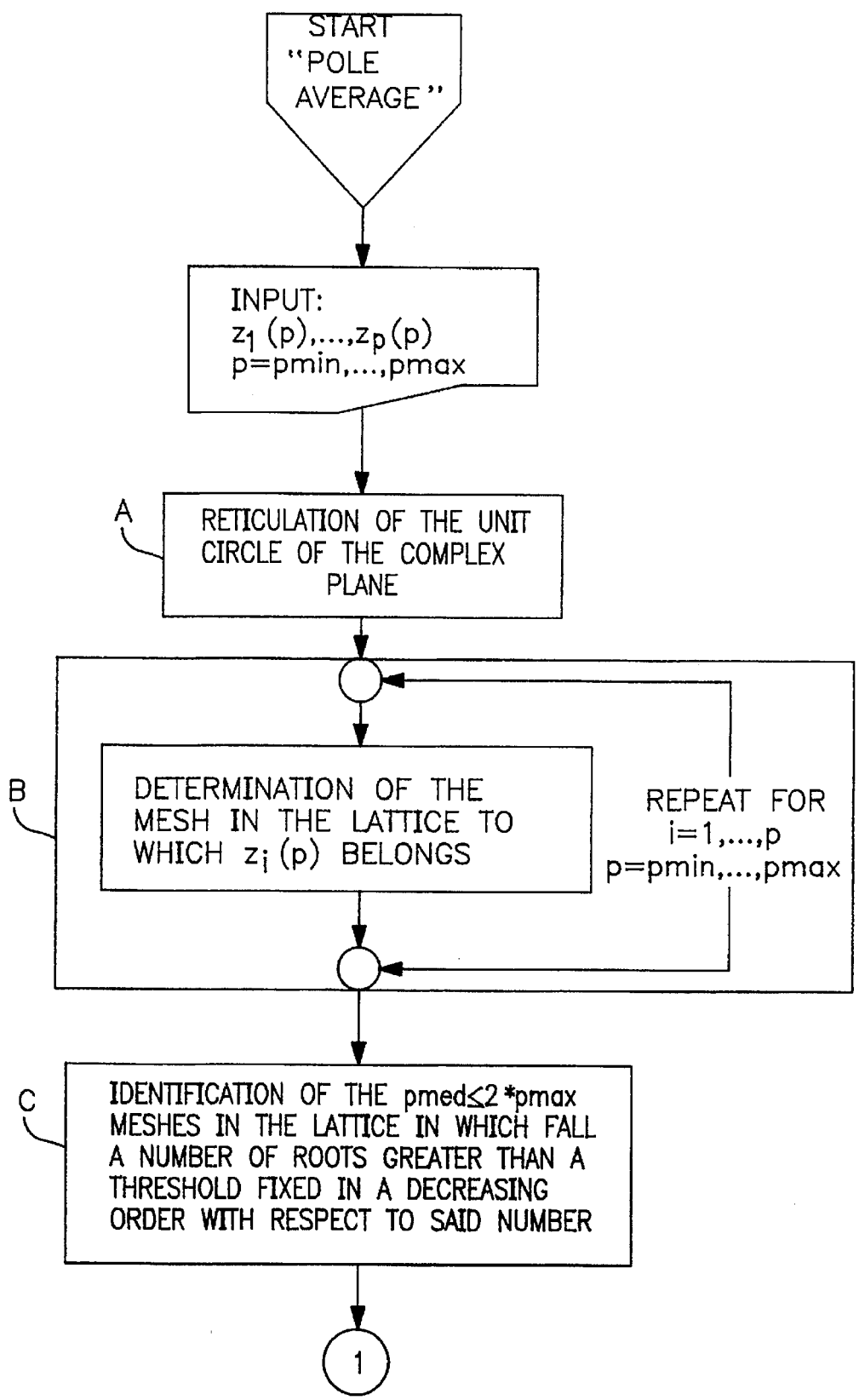
Figure 26B:
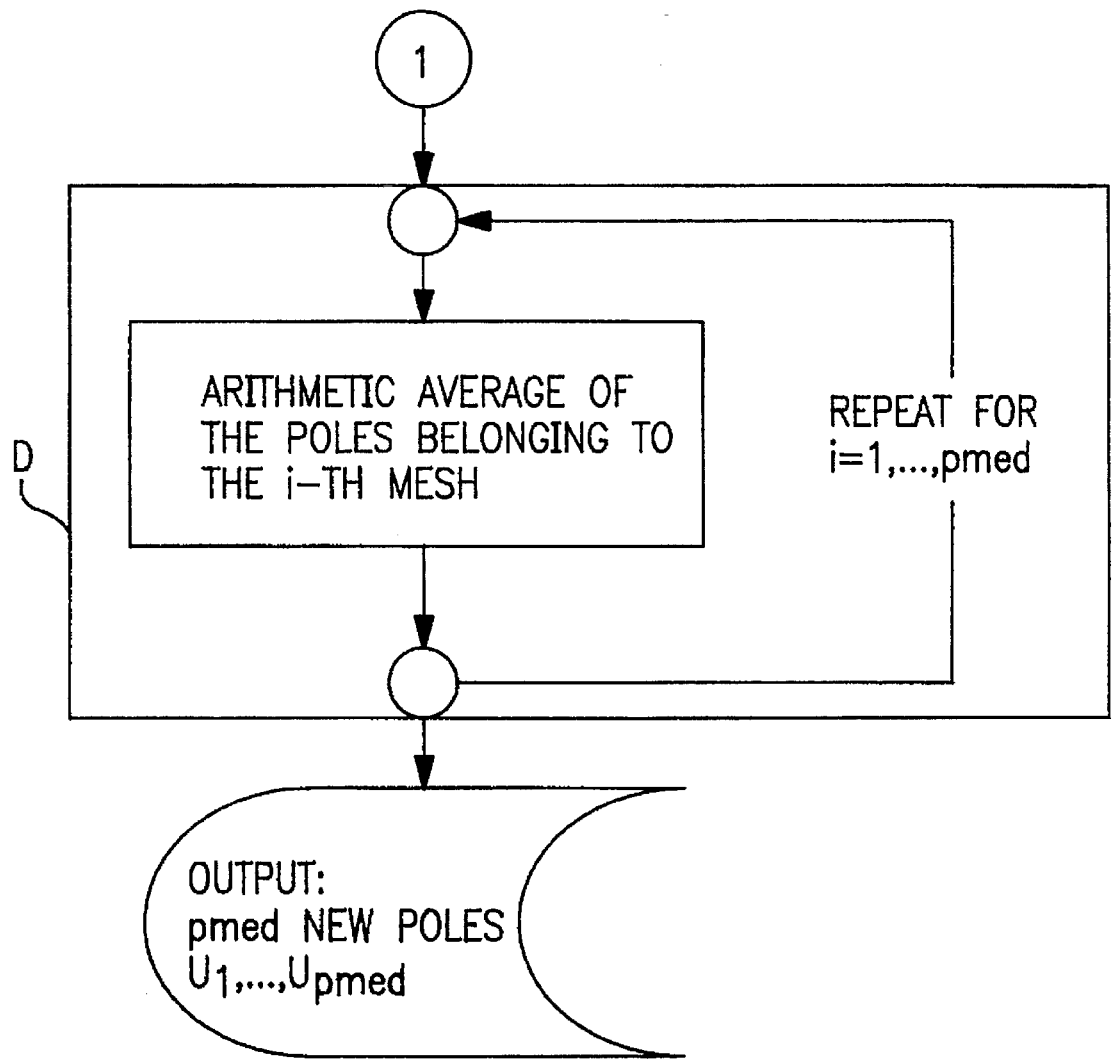

FIG. 26. Flow diagram for the module "AVERAGE POLES".

Figure 27:
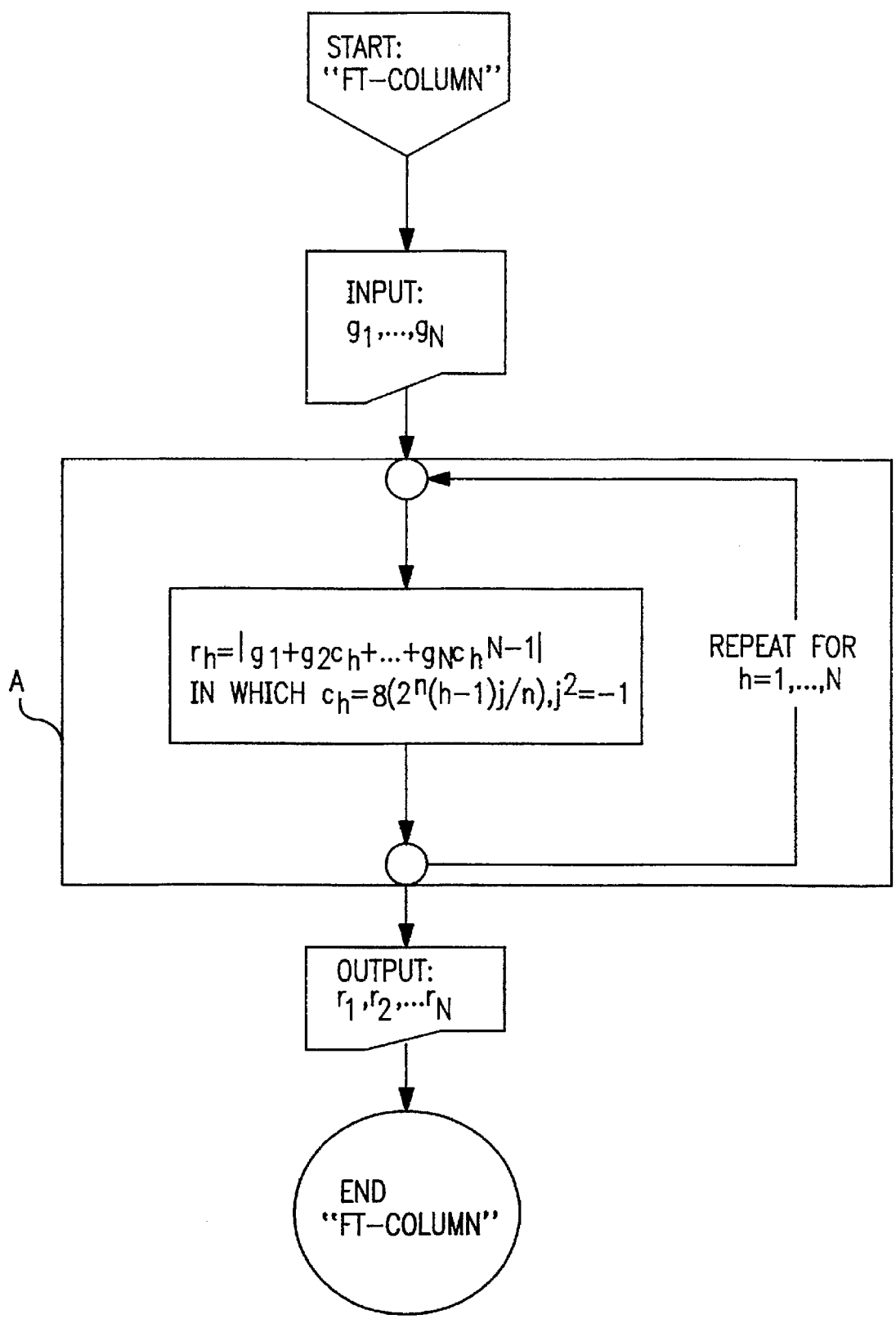

FIG. 27: Flow diagram for the module "FT-COLUMN".

Figure 28A:
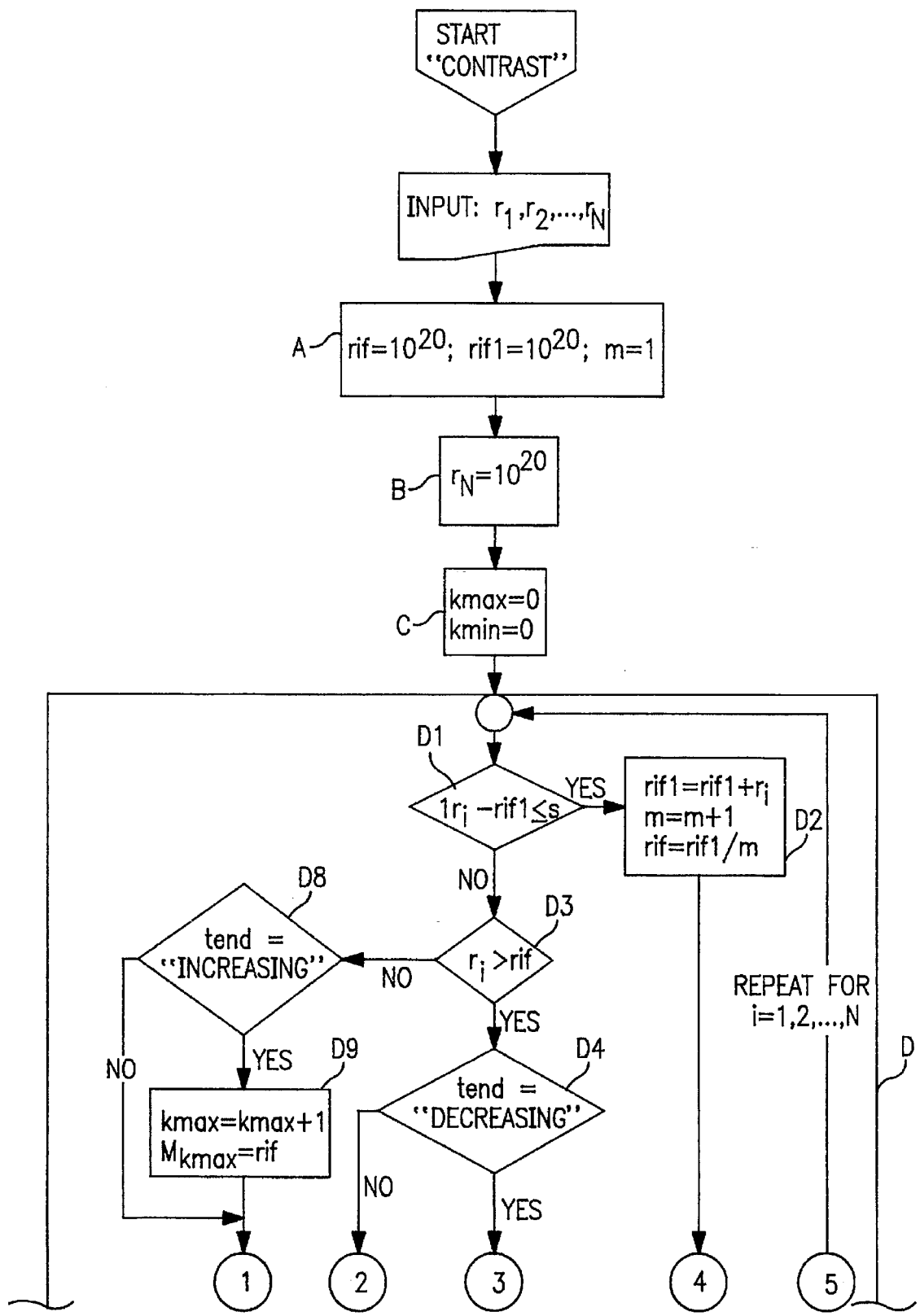
Figure 28B:
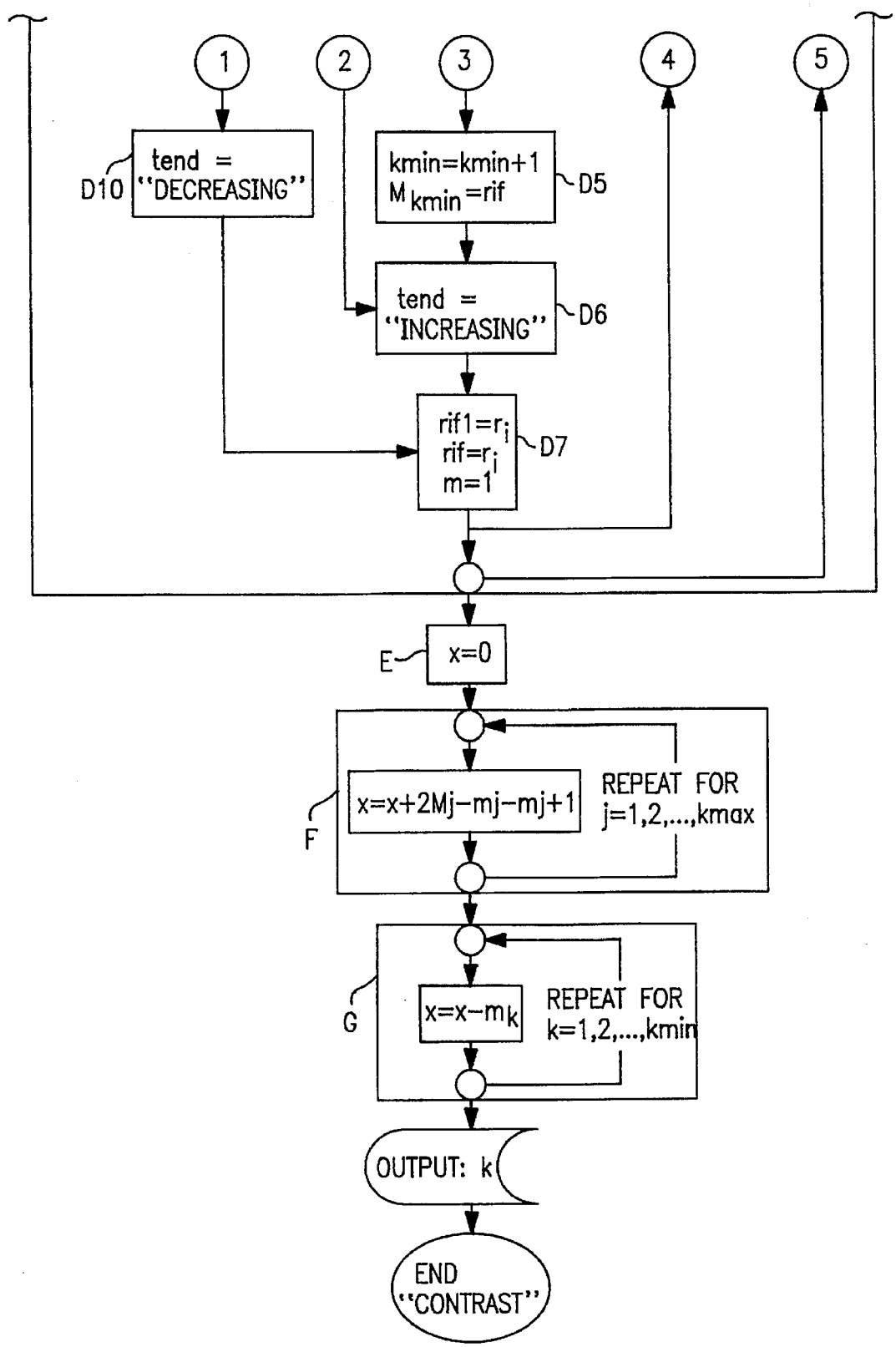

FIG. 28: Flow diagram for the module "CONTRAST".

Operation of the system

The system operates starting from the data measured by the machine, which consist in a matrix S, of complex numbers, made up of n rows and m columns; the row index determines the position in time of the single signal, while the column index determines the signal sampling time (see FIG. 13). Whereas the image produced using the prior art system has an S of the same dimensions, that is to say n rows and m columns, that obtained using the system object of the invention consists in a matrix I having N rows and m columns, in which N>n. It must, furthermore, be underlined that the method, in its most general form, leads to a matrix I having M columns, in which M>m. However, as the total data measurement time is directly proportional to n, whereas it does not depend on m, m is in practice sufficiently large as to render unimportant the effects on the image I of a further increase of the number of its columns, up to M.

With reference to FIG. 17, the system operates as follows:
A) the data measured by the machine are stored in the matrix S, as illustrated in FIG. 13;
B) the user chooses the data gain factor g=N/n=(I no. rows)/(S no. rows);
C) the module "FT-ROWS" substitutes, in an independent manner, each of the n rows in the matrix S of measured data with the corresponding truncated Fourier series of order m;
D) the module "CHOICE OF DATA AND IIR FILTER ORDER" determines the possible groups of data in the generic column of S used for extrapolation of the column itself, and the intervals of variability of the IIR filter order used for extrapolation;
E) the module "PRONY-COLUMNS" forms the image I, with N rows and m columns, processing, in an independent manner, each of the m columns of S.

With reference to FIG. 18, a description will be given of the functioning of module "FT-ROWS". Said module has in input the complex matrix S of measured data, made up of m rows and m columns. The output of said module is a new complex data matrix, still made up of n rows and m columns, and once again indicated with S, obtained from the original one by substituting each row with its truncated Fourier series of order m. In the area indicated by A in FIG. 18, it is possible to observe the substitution, starting from the first row and up to the n-th one, of the generic i-th row of S with its truncated Fourier series of order m.

In FIG. 19, the operation of the module "SUBSTITUTION OF i-TH ROW OF S WITH TRUNCATED FOURIER SERIES" is illustrated. Said module substitutes the i-th row of S, made up of m complex numbers, with its truncated Fourier series of order m, also made up of m complex numbers. In the area indicated with A in FIG. 19, each one of the m data situated on the i-th row of S is substituted with the corresponding element in the truncated Fourier series of order m of the row itself. The k-th element of said series is given by the weighted average of the data $S_{i1}, S_{i2}, \ldots, S_{im}$, situated on the i-th row of S, with weights respectively equal to $1, c_k, c_k^2, \ldots, c_k^{m-1}$, in which $c_k$ is the complex number $e^{2pg(k-1)j}/m$ ($j^2=-1$ and pg is the ratio between circumference and diameter).

After application of the module "FT-ROWS", the data situated on the generic column of S must be extrapolated. To this end, an IIR filter is used. Given the typical morphology of a column of S (see FIG. 20), its extrapolation using the IIR filter takes place separately for the right- and left-hand data tails. Furthermore, the data used by the filter to extrapolate the right-hand tail belong to the right-hand half of the data only, and the same thing goes for the left-hand tail (see FIG. 20). Concentrating on the right-hand tail, two choices of data which can be used by the filter are possible: the first comprises all the n/2 data in the right-hand half, while the second comprises the last [n/3] data ([ ] indicates the whole), that is to say the data with a row index comprised between i=n−[n/3]+1 and i=n; the left-hand tail is dealt with in the same manner. The order of the IIR filter is left free to take on all the values comprised between [0.1nu] and [0.5nu], in which nu is the number of data used by the filter, for us equivalent to n/2, or [n/3]. The possible choices of data used by the filter and the interval of variability of the filter order are assigned by means of the module "CHOICE OF DATA AND IIR FILTER ORDER".

With reference to FIG. 21, a description will be given of the operation of the module "CHOICE OF DATA AND IIR FILTER ORDER". This module has in its input the number n of elements in each column of the matrix S of measured data. The output of said module is made up of the table with the number of data used for extrapolation of the single tail and of those with the minimum and maximum order of the IIR filter used. The area indicated with A in FIG. 21 shows the repeat, for values 2 and 3 of the mu index, which determines the choice of data used to extrapolate the single tail, of the calculation of the number of nu(mu) data used for the single tail, and of the minimum pi(mu) and maximum pf(mu) order possible for the IIR filter.

With reference to FIG. 22, the method of function of the "PRONY-COLUMNS" module is illustrated. This module has as its input the matrix S transformed by the module "FT-ROWS", made up of n rows and m columns. The output of said module is the image matrix I, made up of N rows and m columns. In the area indicated with A in FIG. 22 can be seen the formation of the generic k-th column of I, from the first to the m-th.

The method of function of the module "FORMATION OF THE k-TH COLUMN" is diagrammatically shown in FIG. 23. This module has as an input the n data situated on the k-th column of S, which, for simplicity, are indicated as $d_1, d_2, \ldots, d_n$. Another input parameter is the number N of rows in the image I. The output of said module is the kI-th column of the image I, made up of the N positive numbers $I_{1k}, I_{2k}, \ldots, I_{Nk}$. The data are first processed by the module "EXTRAPOLATION" (area A), which extrapolates n data, until reaching a total of N data, using an IIR filter. As it is possible to vary both the group of data used to extrapolate each one of the two tails identified by the parameter mu, and the order of the IIR filter, indicated with p, the product of said module, that is to say the N data extrapolated, depend both on mu and on p, and are indicated with $cf_1(mu,p), cf_2(mu,p), \ldots, cf_N(mu,p)$. By defining the length of each of the two extrapolated tails lc=(N−n)/2, the extrapolated data have the following structure:

lc extrapolated data in left hand tail–n original data–lc extrapolated data in right hand tail, that is to say: $cf_1(mu,p), \ldots, cf_{lc}(mu,p), d_1, \ldots, d_n, cf_{lc+n+1}(mu,p), \ldots, cf_N(mu,p)$.

The extrapolated data described above have been obtained using the same choice, in both the left and right hand tails, of data used for extrapolation (mu) and of the order of the IIR filter (p). However, as the left and right hand extrapolations are indipendent, the parameters mul and pl, relating to the left hand tail, can be chosen indipendently from mu2 and p2, relating to the right hand tail. Therefore, the general group of N extrapolated data is formed by:

$cf_1(mu1,p1), \ldots, cf_{lc}(mu1,p1), d_1, d_2, \ldots, d_n, cf_{lc+n+1}(mu2,p2), \ldots, cf_N(mu2,p2)$. The choice of the parameters mu1, p1, mu2 and p2, which determine the N extrapolated data, is made in the following manner:

C1) for each possible group of N extrapolated data, the corresponding truncated Fourier series of order N is calculated, as far as the modulus is concerned; this operation is performed by the module "FT-COLUMN";

C2) the "CONTRAST" module calculates a particular contrast measurement for the truncated series mentioned above, in as far as the modulus is concerned;

C3) from the possible groups of N extrapolated data, the one corresponding to maximum contrast is determined;

With reference once again to FIG. 23, it is possible to note, in the area indicated with A, the module "EXTRAPOLATION", and in the area indicated with B, the initialization of the variable $X_M$, which represents the current maximum contrast. In the area indicated by C, the repeated application of a series of modules can be seen. Each repetition is characterized by different values of the four indices mu1, p1, mu2 and p2, which determine, respectively, the choice of data used to extrapolate the left hand tail, the order of IIR filter used to extrapolate the left hand tail, the choice of data used to extrapolate the right hand tail, the order of IIR filter used to extrapolate the right hand tail. In the area indicated by C1, the "FT-COLUMN" module operates, then, in the one indicated by C2, the "CONTRAST" module operates and, following this, if the current contrast X is greater than the maximum current contrast $X_M$, the k-th column of the image I is updated (area C3).

In a distinct version of the method, the module "FORMATION OF k-TH COLUMN" is replaced by the module "FORMATION OF k-TH BIS COLUMN" (see FIG. 23bis). With reference to said figure, the module "EXTRAPOLATION BIS" mediates the information relating to the various possible orders. The product of said module, that is to say the N data extrapolated, depend solely on mu and are indicated as $cf_1(mu), \ldots, cf_N(mu)$. In the area indicated with C there appear the same modules preset in the area C of FIG. 23, but the repetition only occurs for mu1=2,3 and mu2=2,3.

With reference to FIG. 24, a description will be given of the module "EXTRAPOLATION". This module has in input the n data d1, d2, ..., $d_n$, the number N of extrapolated data, the possible groups of data used to extrapolate each of the two tails and the variability intervals of the IIR filter order. The product of said module is made up of the groups of N extrapolated data obtained using the same choice, for both the left hand and right hand tails, of data used for extrapolation (mu) and for the order of the IIR filter (p).

In FIG. 24 can be seen, in the area indicated with A, the calculation of the number 1c of data in each extrapolated tail. In the area indicated with B, repetition of a series of operations takes place. Each repetition is characterized by different values of the indices mu and p, which determine, respectively, the choice of data used for extrapolation of each of the two tails, and the order of the IIR filter used.

Within the area B is first the calculation of the number q of data used for extrapolation of each of the two tails (area B1). Then, in the area indicated with B2 and starting from the data $d_1, d_2, \ldots d_{n/2}$ of the left hand half, formation of the data $y_1, y_2, \ldots , y_q$ takes place, said data being used subsequently by the module "IIR FILTER" to extrapolate the left hand tail. The data $y_1, y_2, \ldots , y_q$ are those obtained by reading the original data $d_1, d_2, \ldots d_{n/2}$, in inverse order starting from the q-th and ending with the first, after which the first datum $y_1$ is given the value $d_q$, the second datum $y_2$ is given the value $d_{q-1}$ and so on until reaching the q-th datum $y_q$, which is given the value $d_1$.

Following this, in the area indicated with B3, the module "IIR FILTER" can be seen, which, starting from the q data $y_1, y_2, \ldots , y_q$, extrapolates the 1c data $y_{q+1}, y_{q+2}, \ldots , y_{q+1c}$. In the area indicated with B4, assignation of the 1c extrapolated data $cf_1(mu,p), \ldots, cf_{1c}(mu,p)$ of the left-hand tail takes place. The 1c extrapolated data of the left hand tail, assigned, are those obtained by reading the 1c data $y_{q+1}, y_{q+2}, \ldots , y_{q+1c}$ in inverse order starting from the 1c-th and ending with the first, thus the first datum $cf_1(mp,p)$ is assigned the value $y_{q+1c}$, the second datum $cf_2(mp,p)$ is assigned the value $y_{q+1c-1}$, and so on until reaching the 1c-th datum $cf_{1c}(mu,p)$, which is assigned the value $y_{q+1}$.

Following this, in the area indicated with B5, assignation of the values to the central part of the extrapolated data $cf_{1c+1}(mu,p), \ldots, cf_{1c+n}(mu,p)$ takes place. The values assigned are the n original data $d_1, \ldots, d_n$, thus the (1c+1)-th datum $cf_{1c+1}(mu,p)$ is assigned the value $d_1$, the (1c+2)-th datum $cf_{1c+2}(mu,p)$ is assigned the value $d_2$, and so on until reaching the (1c+n)-th datum $cf_{1c+n}(mu,p)$, which is assigned the value $d_n$.

In the area indicated with B6, starting from the data $d_{n/2+1}, \ldots, d_n$ of the left hand side, formation of the data $y_1, y_2, \ldots , y_q$, subsequently used by the muodule "IIR FILTER" to extrapolate the right hand tail, takes place. The data $y_1, y_2, \ldots , y_q$ which are formed are those obtained by reading the original data $d_{n/2+1}, \ldots, d_n$, starting from the (n-q+1)-th and ending with the n-th, thus the first datum $y_1$ is assigned the value $d_{n-q+1}$, the second datum $y_2$ is assigned the value $d_{n-q+2}$, and so on until reaching the q-th datum $y_q$, which is assigned the value $d_n$.

Following this there can be seen, in the area indicated with B7, the module "IIR FILTER", which, starting from the q data $y_1, y_2, \ldots , y_q$, extrapolates the 1c data $y_{q+1}, y_{q+2}, \ldots , y_{q+1c}$.

In the area indicated with B8, assignment of the 1c extrapolated data $cf_{1c+n+1}(mu,p), \ldots, cf_N(mu,p)$ in the right hand tail takes place. The 1c extrapolated data in the right hand tail, assigned, are those obtained by reading the 1c data $y_{q+1}, y_{q+2}, \ldots , y_{q+1c}$, starting from the first and ending with the 1c-th, thus the (1c+n+1)-th datum $cf_{1c+n+1}(mu,p)$ is assigned the value $y_{q+1}$, the (1c+n+2)-th datum $cf_{1c+n+2}(mu, p)$ is assigned the value $y_{q+2}$, and so on until reaching the N-th datum $cf_N(mu,p)$, which is assigned the value $y_{q+1c}$.

In a specific version of the method, the module "EXTRAPOLATION" is replaced by the module "EXTRAPOLATION BIS" (see FIG. 24bis). In the area indicated with B in FIG. 24bis there appear the same modules found in the area B of FIG. 24, with the exception of the module "IIR FILTER BIS". Furthermore, repetition only takes place for mu=2,3.

With reference to FIG. 25, the method of function of the module "IIR FILTER" will now be shown. Said module has in input the q complex data $y_1, y_2, \ldots , y_q$, the order p of the IIR filter and the number 1c of new data which are to be extrapolated. The output of said module are the 1c new complex extrapolated data elements $y_{q+1}, y_{q+2}, \ldots , y_{q+1c}$. In the area indicated with A in FIG. 25, starting from the q complex data $y_1, y_2, \ldots , y_q$, identification of the p complex coefficients $a_1, a_2, \ldots , a_p$ of the filter takes place. Said identification is made by chosing the values of the coefficients which minimize the sum of the quadratic deviation between the generic k-th datum $y_k$ of the q-p data $y_{p+1}, y_{p+2}, \ldots , y_q$ and the corresponding value given by the linear combination, with coefficients $a_1, a_2, \ldots , a_p$, of the p data $y_{k-1}, y_{k-2}, \ldots , y_{k-p}$ immediately preceding it, that is to say $a_1 y_{k-1} + a_2 y_{k-2} + \ldots + a_p y_{k-p}$. In the area indicated with B, calculation of the p distinct complex numbers $z_1, z_2, \ldots , z_p$ takes place, said numbers forming the poles of the filter transfer function. In the area indicated with C, identification of the p filter coefficients $b_1, b_2, \ldots , b_p$ can be seen. In the area indicated with D, by means of the calculation of the filter response, based on the first formula in area A (given that $0 = y_0 = y_{-1} = y_{-2} = \ldots$), the 1c extrapolated values $y_{q+1}, y_{q+2}, \ldots y_{q+1c}$ are obtained. It should be noted that this can be implemented in firmware. In an equivalent manner, the generic k-th datum $y_k$ of the 1c extrapolated data $y_{q+1}, y_{q+2}, \ldots, y_{q+1c}$ can be calculated be means of the formula $y_k = w_1 z_1^k + w_2 z_2^k + \ldots + w_p z_p^k$, in which the p coefficients $w_1, w_2, \ldots, w_p$ are those which minimize the expression $$\sum_{k=1}^{q} |y_k - (w_1 z_1^k + \ldots + w_p z_p^k)|^2.$$

In a specific embodiment of the method, the module "IIR FILTER" is replaced by the module "IIR FILTER BIS" (see FIG. 25bis). With reference to FIG. 25bis, the method of operation of the module "IIR FILTER BIS" will be illustrated. Said module has in input the q complex data $y_1, y_2, \ldots, y_q$, the maximum and minimum orders pmax and pmin of the IIR filter and the number 1c of new data which are to be extrapolated. The output of said module are the 1c new complex extrapolated data elements $y_{q+1}, y_{q+2}, \ldots, y_{q+1c}$. In the area indicated with A in FIG. 25bis, repetition of modules A and B of FIG. 25 is seen. Each repetition is characterized by the order p of the IIR filter used. For said repetition there are available the poles $z_1(p), \ldots, z_p(p)$ with p which ranges from pmin to pmax.

In the area indicated with B, the module "AVERAGE OF POLES" can be seen, which has in input the poles $z_1(p), \ldots, z_p(p)$ and in output the pmed averaged poles $v_1(1), \ldots, v_p(pmed)$. In the area indicated with C, identification of the pmed coefficients $b_1, b_2, \ldots, b_{pmed}$ of the filter can be seen. In the area indicated with D, by means of calculation of the filter response, the 1c extrapolated values $y_{q+1}, y_{q+2}, \ldots, y_{q+1c}$ are obtained. The generic k-th datum $y_k$ of the 1c extrapolated data $y_{q+1}, y_{q+2}, \ldots, y_{q+1c}$ is calculated by means of the formula $y_k = w_1 v_1^k + w_2 v_2^k + \ldots + w_{pmed} v_{pmed}^k$, where the pmed coefficients $w_1, w_2, \ldots, w_{pmed}$ are those which minimize the expression $$\sum_{k=1}^{q} |y_k - (w_1 z_1^k + \ldots + w_{pmed} v_{pmed}^k)|^2$$

With reference to FIG. 26, a description will be given of the operation of the module "AVERAGE POLES". Said module has in input all the poles $z_1(p), \ldots, z_p(p)$, with p=pmin, ..., pmax, obtained by varying the order of the IIR filter from the minimum to the maximum value allowed. The output of said module is formed by the pmed new poles $v_1, \ldots, v_{pmed}$, which will be used for extrapolation of the data. In the area indicated with A the unitary circle of the complex plane is divided into nr circular sectors of equal width and into nc circular coronas whose radii follow a potential with a lowest positive exponent of 1. In this way, the construction of a lattice of the unitary circle into nr*nc meshes is performed. In the area indicated with B each of the available poles is represented in the complex plane and, for each pole lying within the unitary circle, the mesh to which it belongs is determined. In the area indicated with C, the meshes of the lattice are put into decreasing order with respect to the number of poles belonging to each one. The first pmed <=2*pmax meshes of the lattice which comprise a number of poles greater than a preset threshold are then taken into consideration. In the area D, for each of the pmed meshes thus identified, the arithmetic average of the poles belonging thereto is calculated. In this way, pmed complex numbers $v_1, \ldots, v_{pmed}$ are obtained, forming the averaged poles.

With reference to FIG. 27, the method of function of the module "FT-COLUMN" will now be described. Said module has in input the k-th column of extrapolated data, for simplicity indicated with $g_1, \ldots, g_N$. The output of this module is the truncated Fourier series, as far as the modulus is concerned, of order N, of said column $r_1, r_2, \ldots, r_N$, which represents a candidate for the k-th column of the image I. In the area indicated with A in FIG. 27, there can be seen the calculation, starting from the first and ending with the N-th, of each of the elements $r_1, r_2, \ldots, r_N$ of the truncated Fourier series, as far as the modulus is concerned, of order N, of the extrapolated data. The value assigned to $r_h$ is the modulus of the weighted average of the extrapolated data $g_1, \ldots, g_N$, with weights equal, respectively, to $1, c_h, c_h^2, \ldots, c_h^{N-1}$, where $c_h$ is the complex number $e^{2\pi g(h-1)j/N}$ (j is the immaginary unit, that is to say $j^2 = -1$).

With reference to FIG. 28, operation of the module "CONTRAST" will now be illustrated. Said module has in input the succession $r_1, r_2, \ldots, r_N$ of N positive numbers forming a candidate to become a column of the image I. The output from said module is the value X of a particular contrast measurement, relating to said candidate. To define the contrast measurement, it is necessary to take into consideration the values of the relative maxima kmax, $M_1, M_2, \ldots, M_{kmax}$, and the values of the relative minima kmin $m_1, m_2, \ldots, m_{kmin}$ of the succession $r_1, r_2, \ldots, r_N$. It obviously follows that between two consecutive relative maxima there is always a relative minimum. As, furthermore, the first and last values of the succession $r_1, r_2, \ldots, r_N$ are generally much lower that the remaining values, it can be assumed that the first minimum $m_1$ precedes the first maximum $M_1$, and that the last minimum mkmin follows the last maximum $M_{kmax}$. The configuration $m_1, M_1, m_2, M_2, \ldots, M_{kmax}, m_{kmin}$ is thus obtained, with the obvious condition kmin=kmax+1. The contrast measurement considered is the sum, starting from the first relative maximum and ending with the last, of the two differences obtained between the value $M_i$, of the generic i-th relative maximum, and those of the two relative minima $m_i$ and $m_{i+1}$, one preceding and the other following the maximum under consideration, less the sum of the kmin relative minima, that is to say:

$$X = \sum_{i=1}^{kmax} (M_i - m_i + M_i - m_{i+1}) - \sum_{i=1}^{kmin} m_i.$$

The determination of the relative maxima and minima takes place in the following manner: a positive number s is determined, known as the threshold, equivalent to 3 times the standard deviation of the background noise in the image reconstructed using the known method (truncated Fourier series); each element $r_i$ is compared with a reference value, calculated as explained below, then, if the difference between $r_i$ and the reference is greater than the threshold, the label "increasing" is associated to the element $r_i$, while if, on the contrary, the difference between the reference and $r_i$ is greater than the threshold, the label "decreasing" is associated to $r_i$, and if neither of the two conditions is found, the element $r_i$ is given the label "stationary". The stationary elements comprised between a decreasing element and the first successive increasing element fix a relative minimum, the value of which is calculated as the arithmetic average of the stationary and decreasing elements. A relative maximum is defined in an entirely similar way. The reference value, corresponding to element $r_i$, will be equal to the arithmetic average of the preceding stationary elements $r_i$, up to and including the nearest increasing or decreasing element. A very high value is assigned to the reference corresponding to the first element $r_1$, so that $r_1$, which is always very small, results a decreasing element. This guarantees that the first relative maximum or minimum found is a minimum. In a similar way, the final element $r_N$, which is always very small, is forcedly assigned an extremely high value, so that $r_N$ always results an increasing element. This guarantees that the last relative maximum or minimum found is always a minimum. In the area indicated with A in FIG. 28, initialization of the reference rif relating to the first datum can be seen, whereas in the area indicated with B assignment of an extremely high value to the final datum can be seen, and the area indicated with C shows resetting of the counters kmax and kmin of the number of relative maxima and minima, respectively. In the area indicated with D can be seen the repetition, starting from the first element and ending with the last, of the operations described hereabove, to determine the relative maxima and minima. In particular, in the area indicated with D1, comparison is made between the modulus of the difference between the current element $r_i$ and the current reference rif, and the threshold. If said modulus is smaller that the threshold, one passes on to the area indicated with D2, where the reference value is updated, otherwise, one passes on to the area indicated with D3, where the current datum $r_i$ is compared with the current reference rif. If the current value $r_i$ is greater that the durrent reference rif, one passes on to the area indicated with D4, otherwise one passes on to the area indicated with D8. In the area indicated with D4, there is an interrogation as to whether the variable tend has the label "decreasing". If the above is true, one passes on to the area indicated with D5, where the value of the counter kmin of relative minima is increased by one unit and the current reference is assigned to the value of the current relative minimum, otherwise one passes on to the area indicated with D6. In the area indicated with D6, the variable tend is assigned the label "increasing", and one passes on to the area indicated with ED7, where the current reference is reinitialized, assigning it the current element $r_i$. In the area indicated with D8 an interrogation is performed as to whether the variable tend has the label "increasing". If the above is true, one passes on to the area indicated with D9, where the value of the relative maxima counter kmax is incremented by one unit and the current reference is assigned to the value of the current relative maximum, otherwise one passes on to the area indicated with D10. In the area indicated with D10 the variable tend is assigned the label "decreasing", and one passes on to the area indicated with D7. Following the area indicated with D, in the area indicated with E resetting of the contrast X can be seen, in the area indicated with F a first calculation of X takes place, summing, starting from the first relative maximum and ending with the last one, the two differences obtained between the value $M_i$ of the generic i-th relative maximum and those of the two relative minima $m_i$ and $m_{i+1}$, one preceding and the other following the maximum under consideration. Finally, in the area indicated with G, the values of the relative minima, starting from the first and ending with the last, are subtracted from the value of X calculated above.

Industrial application

The system object of the invention can be used, both in its basic form and in its modified version, to form an MR image, with a resolution (number of pixels) fixed by the operator, indipendent of the dimensions of the data matrix measured by the machine. The limits of resolution are only set by the visualization means and by the available memory. The modified version provides images of slightly lower quality (see FIG. 1d) with respect to the basic version (see FIG. 1c), although often said differences cannot be seen by the naked eye. The numeric complexity of the basic version is proportional to the maximum order of the IIR filter elevated to the power of three, while that of the modified version is proportional to the square of the maximum order of IIR filter. Using an Apollo series 10000 with a single CPU model 1989, with scalar execution, the time required to form an image 256×256 starting from 128 measured signals is 110 minutes for the basic version and 4 minutes for the modified one. The two versions of the method lend themselves to a high level of parallelization, so that the calculation cost is inversely proportionate to the number of processors available.

The high level of parallelization derives from the fact that each column of the image can be processed indipendently of the others, that the extrapolation of the positive index Fourier coefficients of each column of the image is performed indipendently of that of the negative index coefficients, that both the extrapolation of the positive index coefficients and that of the negative index ones is performed using two distinct choices of the measured coefficients in an indipendent manner, that extrapolation of the Fourier coefficients uses, in an indipendent manner, an IIR filter whose order varies within a prefixed interval.

We claim:

1. A method for producing high-resolution magnetic resonance images with a short measurement time from the data measured by a MR machine, comprising the step of:

formation of each column of the image to be produced independently from the others, wherein a calculation is carried out of a plurality of groups of a finite number of extrapolated Fourier coefficients for each column, each group being determined by a unique and variable choice of the column data used for extrapolation and the order of an IIR filter, said column data being derived from data obtained from a MR machine.

2. A method according to claim 1, characterized in that said step of forming each column of the image to be produced comprises the generation of subgroups of measured Fourier coefficients capable of identifying the parameters of two filters for extrapolation, respectively, of Fourier coefficients with a positive and negative index.

3. A method according to claim 2, characterized in that said two filters are made up of two IIR filters, the order of which varies over a finite interval of values.

4. A method according to claim 3, characterized in that the use of the IIR filters comprises the following steps:

identification of the coefficients of the polynominal which appears to the denominator in the filter transfer function;

calculation of the poles of the transfer function;

calculation of the response to the unit impulse of the filter.

5. A method according to claim 3, characterized in that use of the IIR filters comprises the following steps:

identification of the coefficients of the polynomial which appears to the denominator in the filter transfer function;

calculation of the poles of the transfer function;

average of the poles of the filter transfer functions relating to different orders;

calculation of the response to the unit impulse of the filter.

6. A method according to claim 4, characterized in that the calculation of the response to the unit impulse is performed in a recursive manner using the equation defining the IIR filter.

7. A method according to claim 4, characterized in that calculation of the response to the unit impulse is performed in a non-recursive manner starting from the poles of the transfer function.

8. A method according to claim 5, for performing the average of the poles of the filter transfer functions relating to different orders, characterized in that the groups of poles which are close to one another in the unitary circle are averaged.

9. A method according to claim 1, further comprising calculation of a contrast measurement of the image column based on a function of the relative maximums and minimums found along the column itself.

10. A method according to claim 9, characterized in that calculation of the contrast measurement of the generic image column comprises the following steps:

predetermination of a threshold correlated with non-significant data representing noise outside the area of interest to the image;

comparison between said threshold and the difference between the current data and a reference value dependent on preceding data.

11. A method according to claim 5, characterized in that calculation of the response to the unit impulse is performed in a non-recursive manner starting from the poles of the transfer function.

12. A method of producing a magnetic resonance image from MRI signal data indicative of a matrix S of coefficients generated by a magnetic resonance imaging machine, the matrix S having n rows and m columns, a row index of the matrix S defining a time position of an MRI signal and a column index of the matrix S defining a sampling time of the MRI signal, said method comprising:

selecting, for one of said m columns, plural different subsets of the n coefficients making up the one of the m columns and plural different filter orders of at least one IIR filter;

extrapolating N coefficients from each subset and filter order, where N>n, to obtain respective plural sets of the extrapolated N coefficients; and determining a one of the plural sets of extrapolated N coefficients which results in an image of maximum contrast after transformation of the N coefficients; and repeating said selecting, extrapolating and determining steps independently for each of the m columns to obtain modified MRI signal data indicative of a matrix I of coefficients having N rows and m columns.

13. A method as claimed in claim 12, wherein said extrapolating step includes applying each of the plural subsets of the n coefficients to each of the filters orders of IIR filter.

14. A method as claimed in claim 12, wherein said extrapolating step includes applying each of the plural different subsets of n coefficients to plural IIR filters having different respective filter orders.

* * * * *